(12) United States Patent
Hirakata

(10) Patent No.: US 7,531,752 B2
(45) Date of Patent: May 12, 2009

(54) FLEXIBLE SUBSTRATE AND ELECTRONIC DEVICE

(75) Inventor: Nobuyuki Hirakata, Shizuoka (JP)

(73) Assignee: NEC Corporation, Tokyo (JP)

( * ) Notice: Subject to any disclaimer, the term of this patent is extended or adjusted under 35 U.S.C. 154(b) by 354 days.

(21) Appl. No.: 10/892,321

(22) Filed: Jul. 16, 2004

(65) Prior Publication Data
US 2005/0018409 A1 Jan. 27, 2005

(30) Foreign Application Priority Data
Jul. 24, 2003 (JP) ............................ 2003-279396

(51) Int. Cl.
*H05K 1/00* (2006.01)
(52) U.S. Cl. .................... 174/254; 174/255; 174/258
(58) Field of Classification Search ............... 361/749, 361/750, 751, 255; 174/255, 256, 257, 254
See application file for complete search history.

(56) References Cited
U.S. PATENT DOCUMENTS

| | | | |
|---|---|---|---|
| 4,394,707 A * | 7/1983 | Consoli | 361/750 |
| 6,784,373 B2 * | 8/2004 | Kusaka | 174/255 |
| 6,900,355 B2 * | 5/2005 | Steiner et al. | 564/308 |
| 6,990,355 B2 * | 1/2006 | Ueyama et al. | 455/550.1 |
| 7,173,568 B2 * | 2/2007 | Kanazawa | 343/702 |
| 2002/0187803 A1 | 12/2002 | Nakamura et al. | |

FOREIGN PATENT DOCUMENTS

| | | |
|---|---|---|
| EP | 1 009 073 A1 | 6/2000 |
| EP | 1 104 049 A1 | 5/2001 |
| JP | 56-63077 | 10/1954 |
| JP | 2-244788 | 9/1990 |
| JP | 2002-158458 | 5/2002 |
| JP | 2002-171033 | 6/2002 |
| JP | 2002-368440 | 12/2002 |
| JP | 2003-195785 | 7/2003 |

* cited by examiner

*Primary Examiner*—Tuan T Dinh
*Assistant Examiner*—Abiy Getachew
(74) *Attorney, Agent, or Firm*—Dickstein Shapiro LLP

(57) ABSTRACT

A flexible substrate inserted in a hinge electrically connects circuit substrates, which are housed in a first casing and a second casing, respectively, to each other. The substrate has a power supply line and signal lines which are formed from a wiring conductor. Slits are opened in border portions of the power supply line in a cranked portion. The slits opened in the border portions of the power supply line make the rigidity of the border portions lower than in prior art. This means that a base is prevented from squashing the wiring conductor (power supply line) when the substrate is bent and that stress concentration on the border portions can accordingly be avoided. As a result, cracks in the border portions are prevented and the power supply line (wiring conductor) is protected against wire breakage.

14 Claims, 14 Drawing Sheets

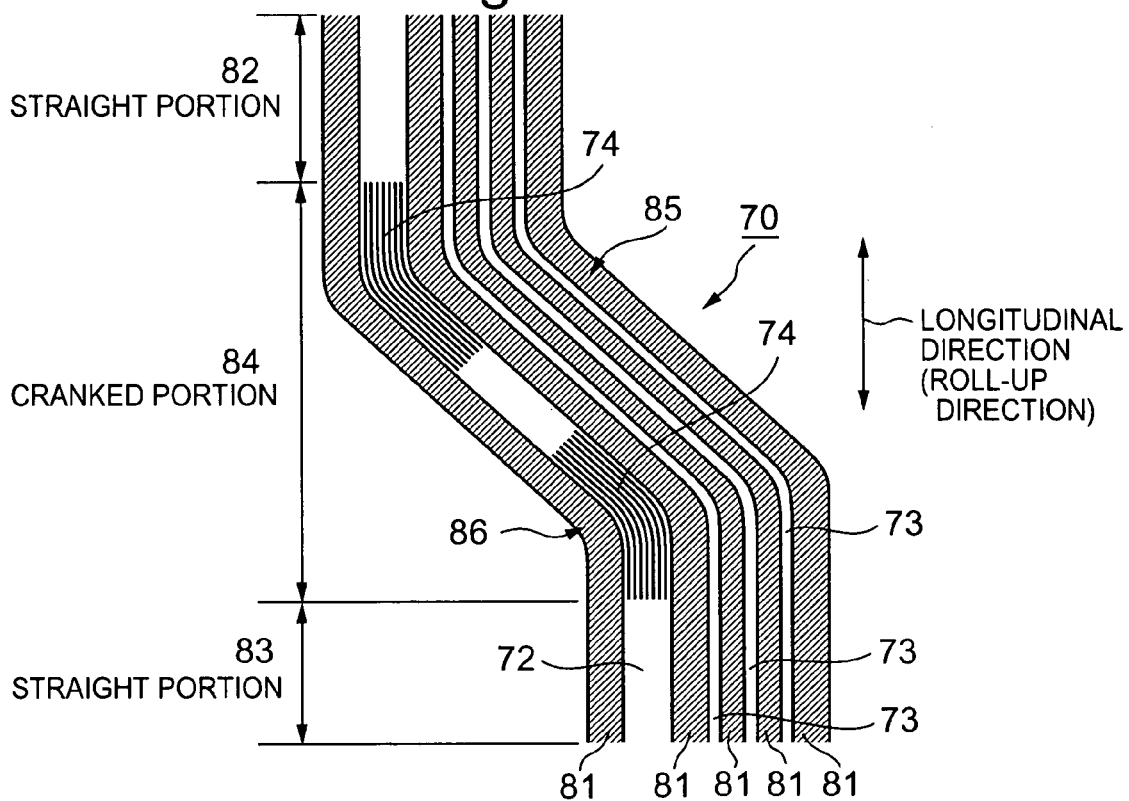
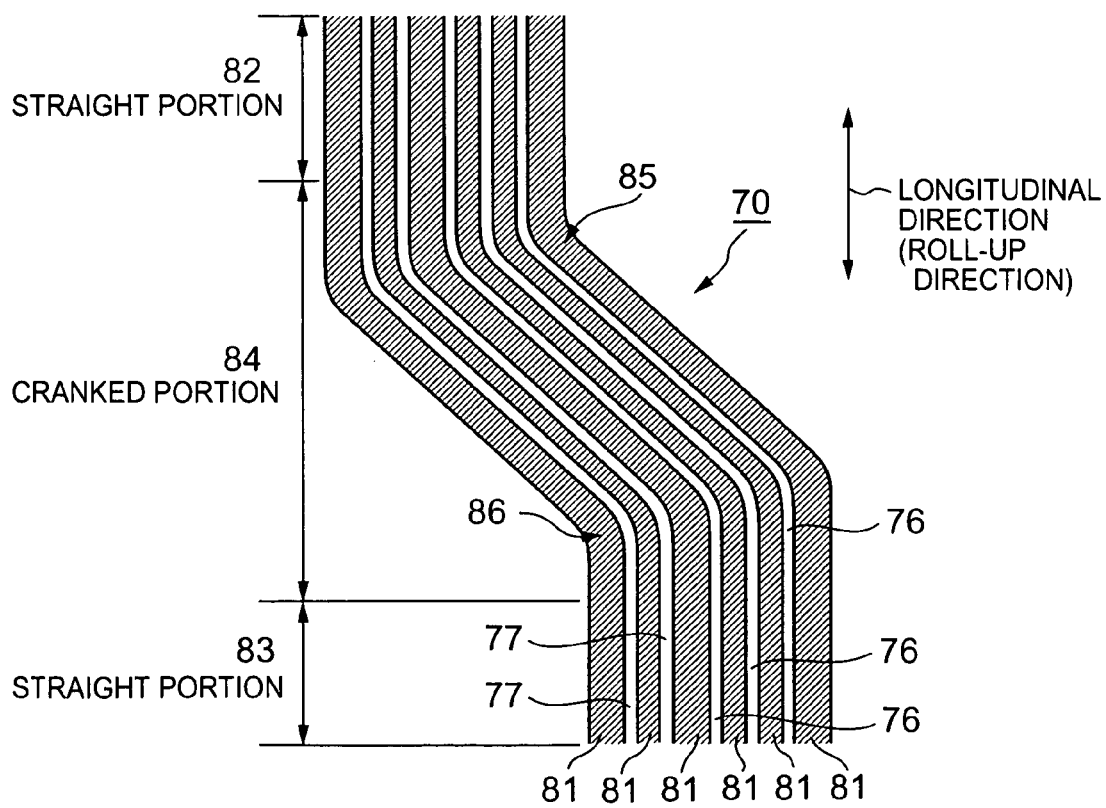

FLEXIBLE SUBSTRATE AND ELECTRONIC DEVICE

BACKGROUND OF THE INVENTION

1. Field of the Invention

The present invention relates to a flexible substrate in which a wiring conductor is arranged from one end to the other end and to an electronic device having this flexible substrate, for example, a portable terminal (cellular phone). More specifically, the invention relates to a foldable (opening/closing) electronic device which is repeatedly folded (closed) and deployed (opened) and to a flexible substrate for electrically connecting circuit substrates to each other which are arranged in a pair of casings in this electronic device.

2. Description of the Related Art (Outline of Cellular Phone Structure)

FIG. 14 shows the schematic structure of a folding portable terminal S. In the portable terminal S, a first casing 200 and a second casing 300 are joined to each other through a hinge 400.

The first casing 200 has plural operation keys and others. A detachable battery (omitted from the drawing) and a circuit substrate 201 are placed inside the first casing 200. Mounted to the circuit substrate 201 are a tact switch, which operates in conjunction with manipulation of the operation keys, and other components.

The second casing 300 has a display. A circuit substrate 301 is placed inside the second casing 300. The circuit substrate 301 is mounted with parts relevant to the display.

(Structure of around Flexible Substrate)

The circuit substrate 201 and the circuit substrate 301 are electrically connected to each other through a flexible substrate 101. The two ends of the flexible substrate 101 are connected to connectors (not shown in the drawing) mounted to the circuit substrates 201 and 301, respectively.

The flexible substrate 101 is, as shown in FIG. 15, wound on itself (one roll) to form a tube-like shape at the middle. The rolled portion of the flexible substrate 101 is housed in the hinge 400, which is a pair of tubes 401 and 402 coupled to each other.

As shown in FIG. 16, the elongated flexible substrate 101 is composed of connection portions 110 and 111, straight portions 112 and 113 and a cranked portion 114, and is formed unitarily. The connection portion 110 is connected to the circuit substrate 201 shown in FIG. 15 whereas the connection portion 111 is connected to the circuit substrate 301 shown in FIG. 15.

Interposed between the connection portions 110 and 111 are the straight portions 112 and 113, which in turn sandwich the cranked portion 114. The cranked portion 114 is formed in a continuous manner between the straight portions 112 and 113.

The straight portions 112 and 113 are extended from the connection portions 110 and 111, respectively, in the longitudinal direction of the flexible substrate 101. The straight portions 112 and 113 are arranged in a staggered fashion in order to avoid overlapping each other when the flexible substrate 101 is bent in some way (rolled, for example).

In short, the cranked portion 114 is set diagonal with respect to the longitudinal direction of the flexible substrate 101 to reach the straight portions 112 and 113 both. As shown in FIG. 16, the plan view of the flexible substrate 101 therefore resembles the shape of the letter Z.

When the first casing 200 and the second casing 300 are opened and put in a deployed state as shown in FIG. 14 (when the second casing 300 is in the position indicated by the chain double-dashed line of FIG. 14), the cranked portion 114 of the flexible substrate 101 is rolled up in the hinge 400 shown in FIG. 15 by a degree not larger than 360° (one roll as shown in FIG. 15).

On the other hand, when the first casing 200 and the second casing 300 are closed and put in a folded state (when the second casing 300 is in the chain dashed line of FIG. 14), the cranked portion 114 of the flexible substrate 101 is rolled up by a degree between 360° and 540° (wound more than once) as shown in FIG. 17.

On one side of the flexible substrate 101, a power supply line 102 and plural signal lines 103 are arranged in the straight portions 112 and 113 and on the cranked portion 114 running between the connection portions 110 and 111 as shown in FIG. 16 (only three of the plural signal lines 103 are shown in FIGS. 16 and 18). The power supply line 102 and the signal lines 103 are formed from a wiring conductor (copper foil or the like).

The power supply line 102 and the signal lines 103 make the circuit substrate 201 and the circuit substrate 301 electrically conductive to each other. The power supply line 102 can have a desired width as long as the electric resistance of the power supply line 102 is equal to or lower than a predetermined level in bar of malfunction by voltage drop.

The signal lines 103 may be smaller in width than the power supply line 102 since the signal lines 103 only have to supply a current as an electric signal. In other words, the signal lines 103 can have a small volume in section since the lines have to carry only a small amount of current. The power supply line 102 is therefore set larger in width than the signal lines 103. The wiring conductor forming the power supply line 102 and the wiring conductor forming the signal lines 103 have the same thickness.

The plan view of the flexible substrate 101 has a cranked shape as shown in FIG. 16 because this enables the tubes 401 and 402 of the hinge 400 shown in FIG. 15 to house the cranked portion 114 of the flexible substrate 101 in a rolled up state. Another reason to give the flexible substrate 101 a cranked shape in plan view is, as well known, to avoid wire breakage of the power supply line 102 and the signal lines 103 in the cranked portion 114 of the flexible substrate 101 when the cranked portion 114 is rolled-up (see FIGS. 15 and 17).

The line width of the power supply line 102 is set uniform throughout the straight portions 112 and 113 and the cranked portion 114 as shown in FIG. 19 due to stabilize uniformity of the electric resistance. The power supply line 102 and the signal lines 103 in FIG. 18 and FIG. 19 are indicated by outlined areas.

To elaborate, a width W4 that is orthogonal to the slant of the cranked portion 114, which is slanted with respect to the longitudinal direction (roll-up direction) of the flexible substrate 101, is equal to a width W2 and a width W3, which denote the widths of the straight portions 112 and 113, respectively (W4=W2=W3).

Similarly, a line width K4 of a portion of the power supply line 102 that is orthogonal to an oblique portion of the power supply line 102 that is in the cranked portion 114 is equal to line widths K2 and K3 of portions of the power supply line 102 that are in the straight portions 112 and 113 (K4=K2=K3)

A width W1 of the cranked portion 114, which is slanted with respect to the longitudinal direction (roll-up direction) of the flexible substrate 101, is orthogonal to the roll-up direction and is wider than any of the widths W2 and W3 of the straight portions 112 and 113 and the width W4 (W2=W3=W4 <W1).

Therefore, as shown in FIG. 19, the cross-sectional area of the straight portions 112 and 113 of the flexible substrate 101 in the direction orthogonal to the roll-up direction differs from the cross-sectional area of the cranked portion 114 of the flexible substrate 101 in the direction orthogonal to the roll-up direction; the cranked portion 114 is larger in cross-sectional area than the straight portions 112 and 113.

In the straight portions 112 and 113, the roll-up direction of the flexible substrate 101 matches the wiring conductor line direction (the direction in which the power supply line 102 and the signal lines 103 run). In the cranked portion 114, on the other hand, the roll-up direction of the flexible substrate 101 does not match the wiring conductor line direction since the cranked portion 114 is slanted with respect to the longitudinal direction of the flexible substrate 101.

This makes a width K1 of the power supply line 102 in the cranked portion 114 different from the widths K2 and K3 of the power supply line 102 in the straight portions 112 and 113 and from the width K4 as described above; the width K1 of the power supply line 102 in the cranked portion 114 is wider than any the widths K2 and K3 of the power supply line 102 in the straight portions 112 and 113 and the width K4 (K2=K3=K4<K1).

The flexible substrate 101 in the hinge 400 shown in FIG. 15 is therefore more rigid in the cranked portion 114 than in the straight portions 112 and 113. In short, the cranked portion 114 has higher rigidity than the straight portions 112 and 113.

With the rigidity varied from one portion of the flexible substrate 101 in a wound (rolled up) state to another, the flexible substrate 101 cannot be curved uniformly without taking some measure to do so. When the flexible substrate 101 is wound (curved), a force proportionate to the radius of curvature is applied to the cranked portion 114 of the flexible substrate 101 as shown in FIG. 20. The reaction force of the flexible substrate 101 is determined by the widths W1 through W3 of the flexible substrate 101 and the line widths K1 through K3 of the power supply line 102 (and the line width of the signal lines 103).

The reaction force is larger in the cranked portion 114 of high rigidity than in the straight portions 112 and 113, and the stress centers around the borders between the cranked portion 114 and the straight portions 112 and 113. This is because the radius of curvature is large in the cranked portion 114 of high rigidity and becomes small in the straight portions 112 and 113 of low rigidity, creating extremely large flexures at the borders between the cranked portion 114 and the straight portions 112 and 113.

In FIG. 21 which shows the flexible substrate 101 in a rolled up state, a compressive force works on the surface of the power supply line (wiring conductor) 102 which is on the inner circumference side whereas a tensile force works on the interface between the power supply line (wiring conductor) 102 and a base 104. This applies a bending force to the wiring conductor 102 and accordingly the wiring conductor 102 receives a squashing force from the direction of the base 104, which is made of synthetic resin.

As shown in FIG. 18, a bending moment acts on the flexible substrate 101 in a border portion 115, which borders the straight portion 112 and the cranked portion 114, and in a border portion 116, which borders the straight portion 113 and the cranked portion 114, thereby causing the stress to center on the border portions 115 and 116. This stress concentration is particularly prominent in the power supply line (wiring conductor) 102 whose wideness makes the rigidity difference between the cranked portion 114 and the straight portions 112 and 113 larger.

The cranked portion 114 of the flexible substrate 101 is housed in the hinge 400 as shown in FIG. 15 while rolled up to such a curvature that does not break the wiring conductors (the power supply line 102 and the signal lines 103 in FIG. 19). As the first casing 200 and the second casing 300 of the portable terminal S are repeatedly deployed (opened) and folded (closed), fatigue from the repetitive opening and closing accumulates in portions of the wiring conductors 102 and 103 where the stress centers. The accumulated fatigue causes cracks 120 (see FIG. 21), which eventually break the wiring conductors 102 and 103. The cracks 102 tend to appear more often in the wiring conductor that forms power supply line 102 since the line width (K1 through K3) of the power supply line 102 is wider than the line width of the signal lines 103.

JP 2002-158458 A discloses a structure that has been designed to solve the above problem. In this structure, slits are opened in the base of the flexible substrate to thereby ease the stress working on the wiring conductors and prevent the wiring conductors from breaking.

The structure according to JP 2002-158458 A needs to add a step of opening the slits in the base to a common flexible substrate manufacturing process. If the slits are to be formed after the wiring conductors are arranged on the flexible substrate, the base cutting work for opening the slits requires carefulness to avoid cutting the wiring conductors by mistake.

On the other hand, if the slits are to be formed before the wiring conductors are arranged on the flexible substrate, the wiring conductors have to be placed between the slits. The structure according to the patent application cited above thus complicates the flexible substrate manufacturing process and lowers the productivity of the flexible substrate.

Furthermore, the widths of the wiring conductors are limited by the interval between the slits in the invention disclosed in the above patent application. The limitation is inconvenient when the width of the power supply line (wiring conductor) which is set such that the current resistance of the power supply line does not exceed a predetermined level has to be changed (increased) in order to prevent power consumption from exceeding a predetermined level.

Since the slit interval limits the width of the power supply line (wiring conductor) to a given width or smaller in the structure according to the patent application cited above, the permissible current is exceeded making it impossible to flow an appropriate current in the wiring conductor.

Moreover, in the invention according to the cited patent application, the direction in which the hinge rotates (the direction indicated by the arrow F in FIG. 8 of JP 2002-158458 A) is orthogonal to the direction in which the slits run (the direction indicated by the arrow E in FIG. 8 of JP 2002-158458 A).

This means that the maximum width of the flexible substrate is limited by the internal diameter of the hinge, and that the flexible substrate cannot have a necessary number of signal lines when the width of the power supply line is set large.

When there are many signal lines, on the other hand, the permissible current per signal line is small. Another problem of the structure according to JP 2002-158458 A is that it is difficult in practice to form slits, each of which has to be 1 mm or more in width, in manufacture of the flexible substrate whose width is limited to the inner diameter of the hinge.

The stress working on the wiring conductor (power supply line) 102 can be reduced by reducing the wiring conductor width throughout the entire length of the wiring conductor 102 (by equally reducing the line widths K1 to K3 shown in FIG. 19). With the stress decreased, fatigue brought by the repetitive deploying and folding described above is prevented from accumulating.

In recent years, portable terminals are demanded to have various advanced functions. The folding portable terminal S is not an exception and is receiving the same demand for more advanced functions.

The folding portable terminal S is therefore required to form wiring conductors (the power supply line 102 and the signal lines 103) at a density higher than the past (to form more of the lines) on the flexible substrate 101, which electrically connects the circuit substrate 201 in the first casing 200 and the circuit substrate 301 in the second casing 300 to each other.

However, increasing the density of the wiring conductors 102 and 103 on the flexible substrate 101 leads to the difference between the rigidity of the cranked portion 114 and the rigidity of the straight portions 112 and 113 and, accordingly, to larger flexures in the border portions 115 and 116.

Also, in order to obtain various advanced functions, it is necessary to supply a large power from the circuit substrate 201 in the first casing 200 to which a battery (power supply pack) is mounted to the circuit substrate 301 in the second casing 300.

A reduction in wiring conductor width throughout the entire length of the power supply line 102 (a uniform reduction of the line widths K1 to K3) therefore raises problems such as an increase in current resistance of the power supply line 102 which leads to malfunction by voltage drop.

In conclusion, the structure according to JP 2002-158458 A is not suitable for portable terminals which are demanded to have advanced functions.

The flexible substrate according to JP2002-158458 A cannot provide advanced functions because its insufficient durability against repetitive deploying and folding (bending) of the portable terminal.

SUMMARY OF THE INVENTION

The present invention has been made in view of the above, and an object of the present invention is therefore to provide
- a flexible substrate having high durability against repetitive bending and capable of providing advanced functions and an electronic device that uses this flexible substrate, for example, a folding portable terminal.

A flexible substrate according to an aspect of the present invention is provided with a wiring conductor running from one end to the other end, and includes:
- a bent portion formed between the two ends of the flexible substrate and bent as the flexible substrate is bent; and
- a first wiring conductor laid between the two ends of the flexible substrate and having slits in at least a portion that corresponds to the bent portion.

For instance, a circuit substrate is placed adjacent to one end of the flexible substrate whereas another circuit substrate is placed adjacent to the other end of the flexible substrate. The circuit substrates are electrically connected to each other by a wiring conductor, e.g., a power supply line or signal lines, arranged on the flexible substrate. The slits are opened (formed) in at least a portion of the wiring conductor that corresponds to the bent portion.

The bent portion of the flexible substrate is bent when the circuit substrates are rotated relative to each other about fulcrums, which are located on edges of the circuit substrates and which are aligned along the edges, for example (a hinge can serve as the fulcrums). With the slits opened in at least the portion of the wiring conductor that corresponds to the bent portion, the stress is prevented from centering on the portion of the first wiring conductor that corresponds to the bent portion (the portion of the wiring conductor where the slits are opened) while the bent portion is being bent. That is, wire breakage of the wiring conductor in the bent portion is avoided despite repetitive bending of the bent portion of the flexible substrate.

A flexible substrate according to the present invention has slits opened only in a portion of a wiring conductor that corresponds to a bent portion and, therefore, can avoid reducing the line width throughout the entire length of a first wiring conductor (e.g., a power line).

In a flexible substrate which is larger in length than width, for example, an extension portion is extended from each end of the flexible substrate in the longitudinal direction of the flexible substrate. The two extension portions are arranged in a staggered fashion in order to prevent the extension portions from overlapping each other when the flexible substrate is bent. A bent portion is positioned to meet the extension portions in a direction that does not match the longitudinal direction (for example, slanted with respect to the longitudinal direction), so that the bent portion is set wider than the extension portions.

In the case where the bent portion is slanted with respect to the longitudinal direction, the line width of the wiring conductor in the slanted portion is larger than the line width of the wiring conductor in the extension portions which run along the longitudinal direction. Slits are opened in the wide portion of the wiring conductor that is in the slanted portion (bent portion) to make the line width of a first wiring conductor, e.g., a power line, substantially uniform throughout the entire length of the power line. The thus structured flexible substrate is applicable to portable terminals and other electronic devices that are demanded to have advanced functions.

A flexible substrate according to the present invention has high durability against repetitive bending and is applicable to portable terminals and other electronic devices with advanced functions.

An electronic device according to another aspect of the present invention is composed of a flexible substrate in which a wiring conductor runs from one end to the other end, the flexible substrate having a bent portion and a first wiring conductor, the bent portion being formed between the two ends of the flexible substrate and bent as the flexible substrate is bent, the first wiring conductor being laid between the two ends of the flexible substrate and having slits opened in at least a portion that corresponds to the bent portion.

An electronic device according to still another aspect of the present invention is composed of:
- a first circuit substrate placed in a first casing;
- a second circuit substrate placed in a second casing; and
- a flexible substrate formed between the first circuit substrate and the second circuit substrate, the flexible substrate including:
  (1) a bent portion which is bent as the circuit substrates are rotated relative to each other by folding the casings; and
  (2) a first wiring conductor on the flexible substrate, which is laid between the first and second circuit substrate and which has slits opened in at least a portion that corresponds to the bent portion.

BRIEF DESCRIPTION OF THE DRAWINGS

In the accompanying drawings:

FIG. 10 is a plan view showing a critical part on one side of a flexible substrate according to Embodiment 3 of the present invention;

FIG. 11 is a plan view showing a critical part on the other side of the flexible substrate of FIG. 10 viewed from the rear side of the flexible substrate;

DETAILED DESCRIPTION OF THE PREFERRED EMBODIMENTS

A description will be given below with reference to FIGS. 1 through 13 on a flexible substrate and electronic device, for example, a portable terminal, according to embodiments of the present invention. Note that a flexible substrate according to any of the embodiments described below is applied to the portable terminal shown in FIG. 14. This means that casings and hinges according to the following embodiments correspond to the casings 200 and 300 and the hinge 400 in FIG. 14, respectively. The casings and hinges according to the embodiments are hereinafter denoted by the same symbols and referred to as casings 200 and 300 and hinge 400 as in FIG. 14.

Figure 14:
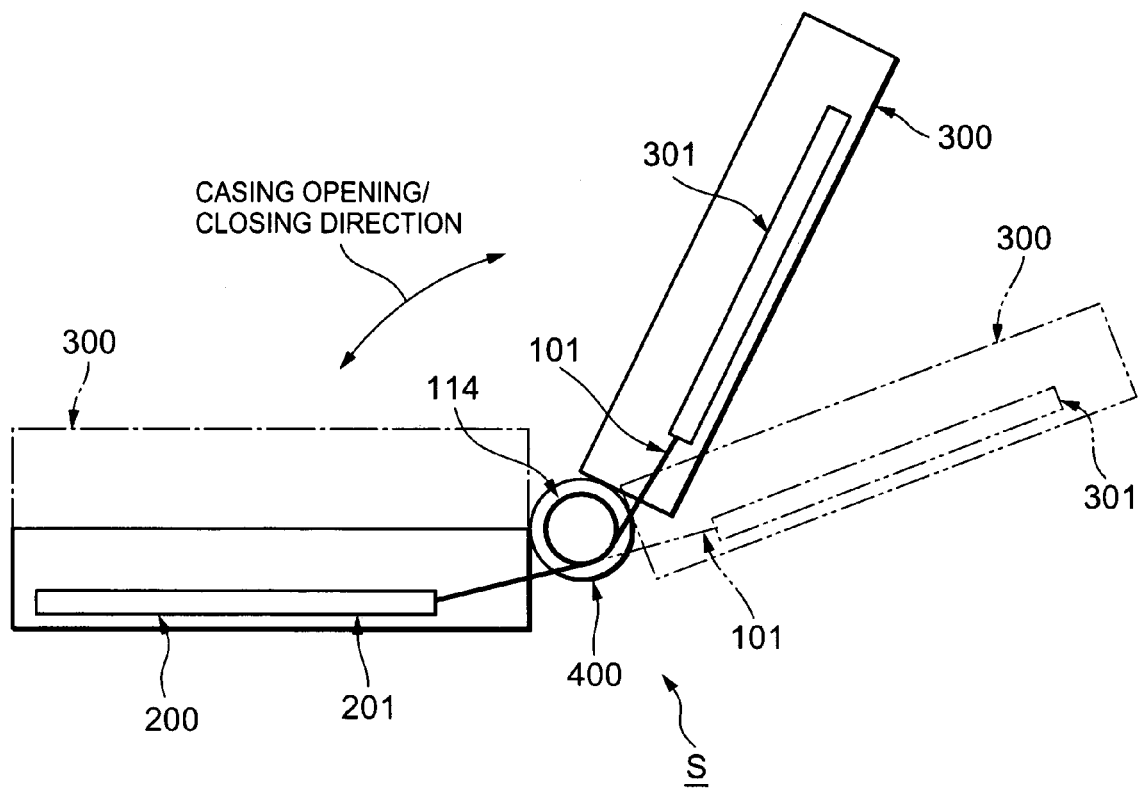
FIG. 14 is a conceptual diagram showing a portable terminal of a type that is folded at a hinge.
Figure 15:
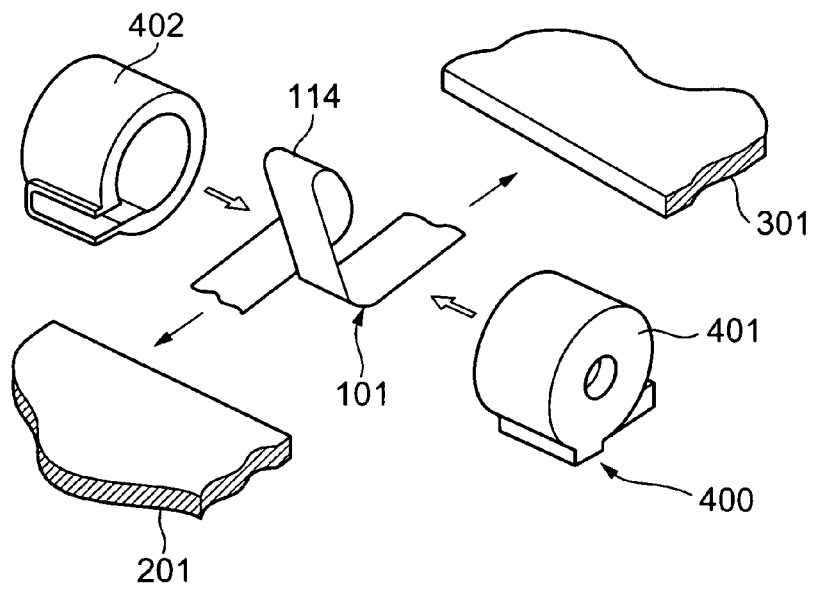
FIG. 15 is an exploded perspective view showing the structure of the hinge in FIG. 14.
Figure 16:
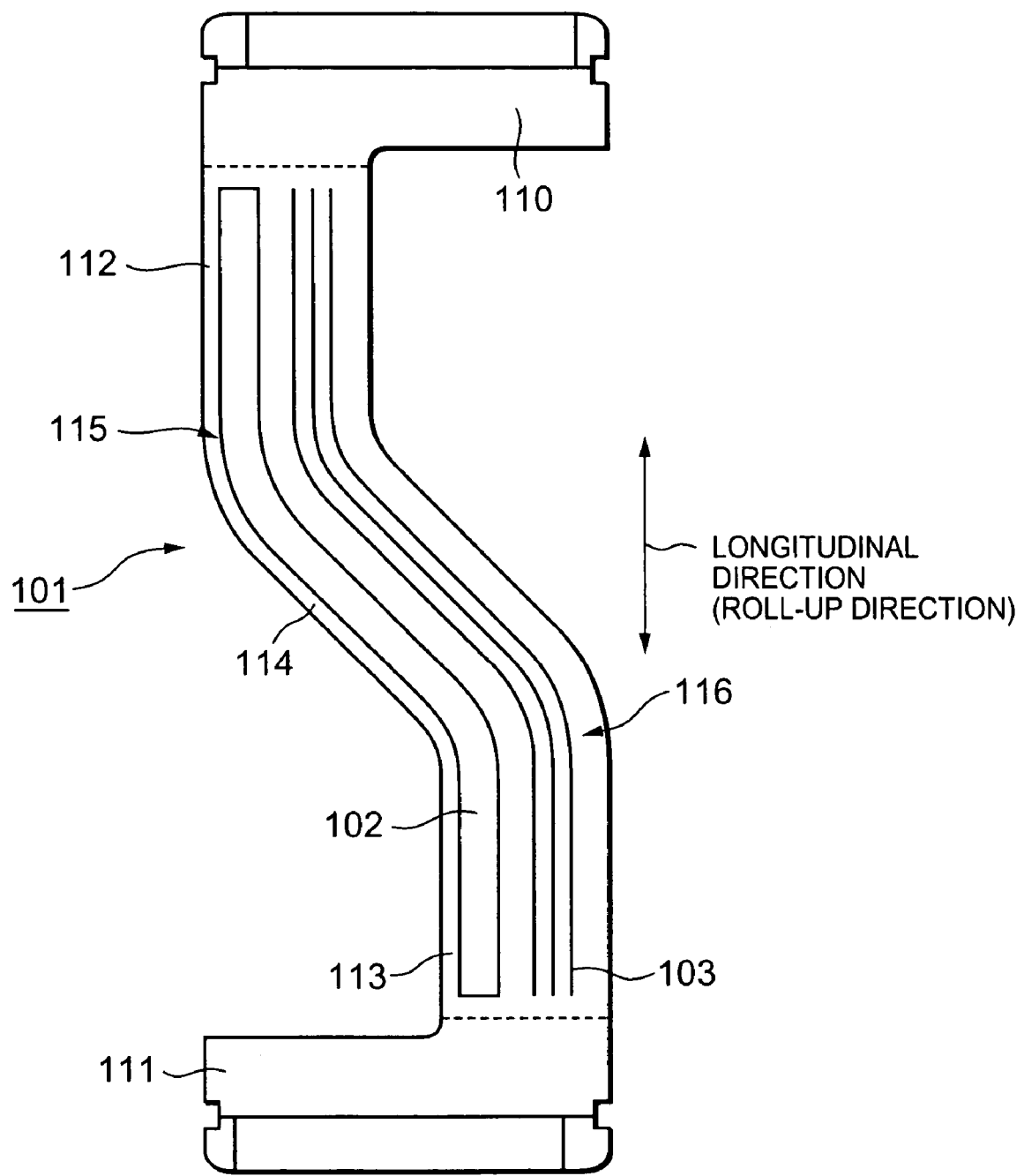
FIG. 16 is a plan view of a conventional flexible substrate applied to the portable terminal shown in FIG. 14.
Figure 17:
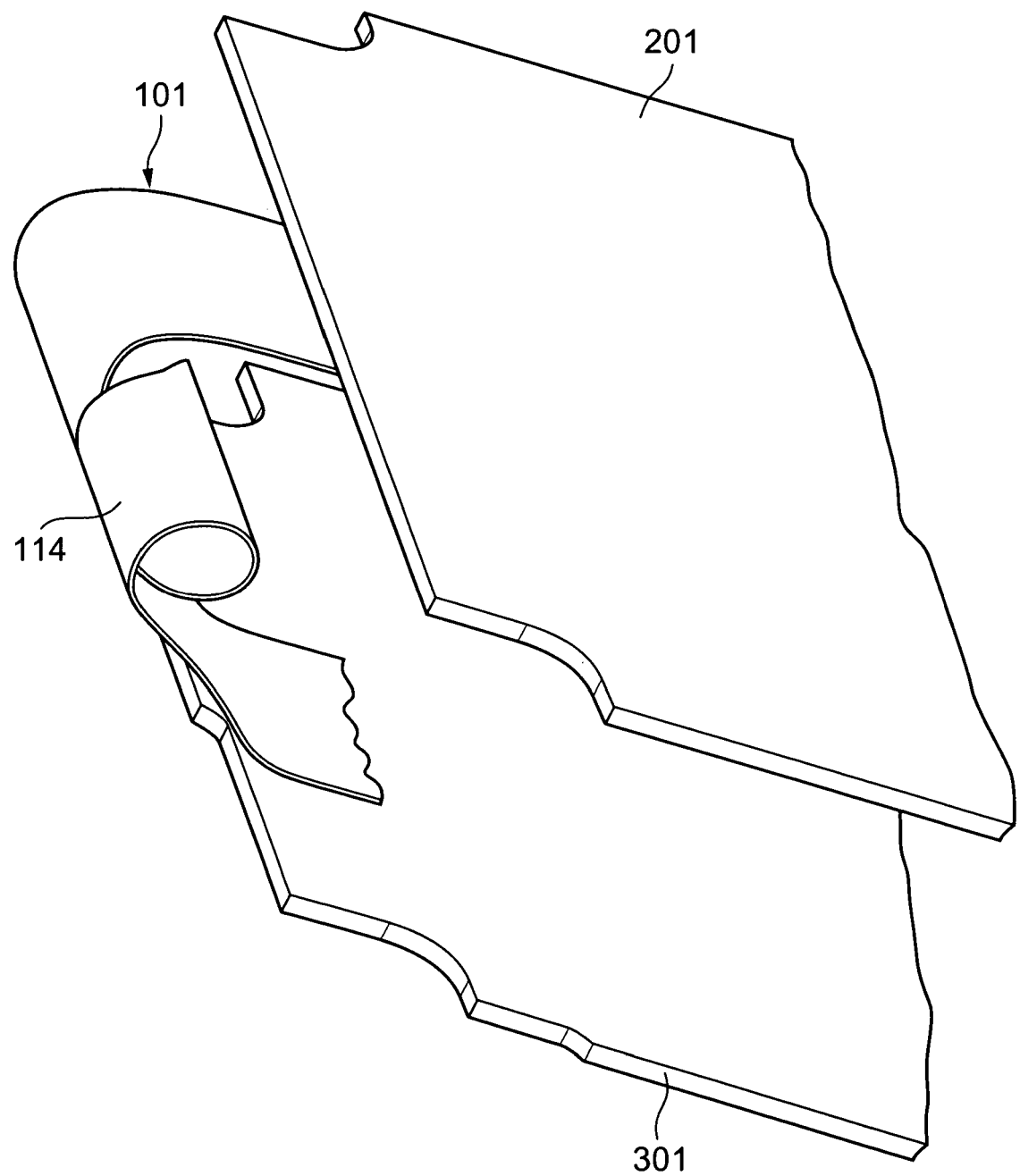
FIG. 17 is a perspective view showing the state of the flexible substrate when the portable terminal of FIG. 14 is folded.

The structure and operation of the portable terminal shown in FIGS. 14, 15 and 17 hold true for the following embodiments except the part relevant to the flexible substrate 101 shown in FIG. 16, and therefore a detailed description on them is omitted here.

Embodiment 1

Figure 1:
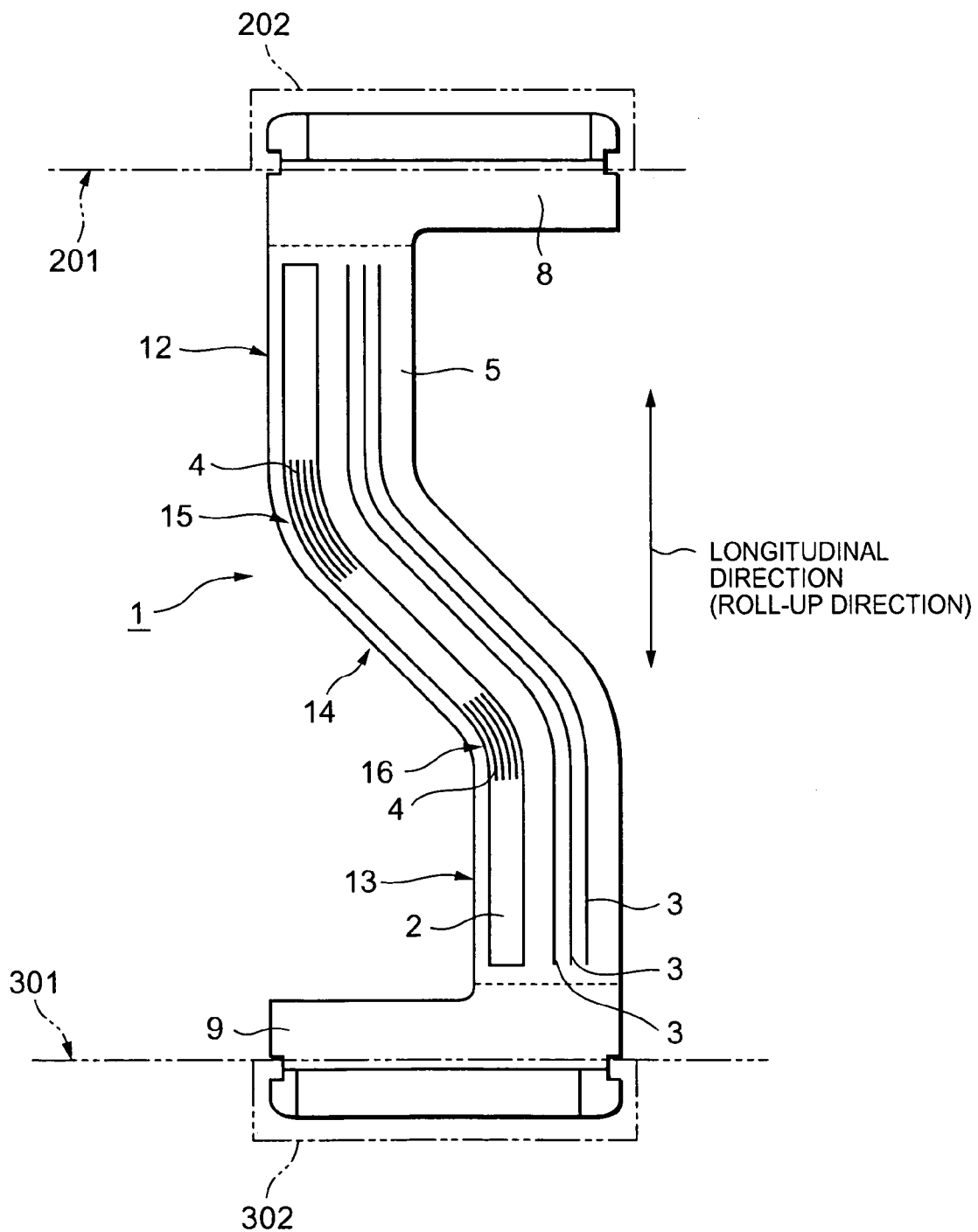
FIG. 1 is a plan view of a flexible substrate according to Embodiment 1 of the present invention.
Figure 2:
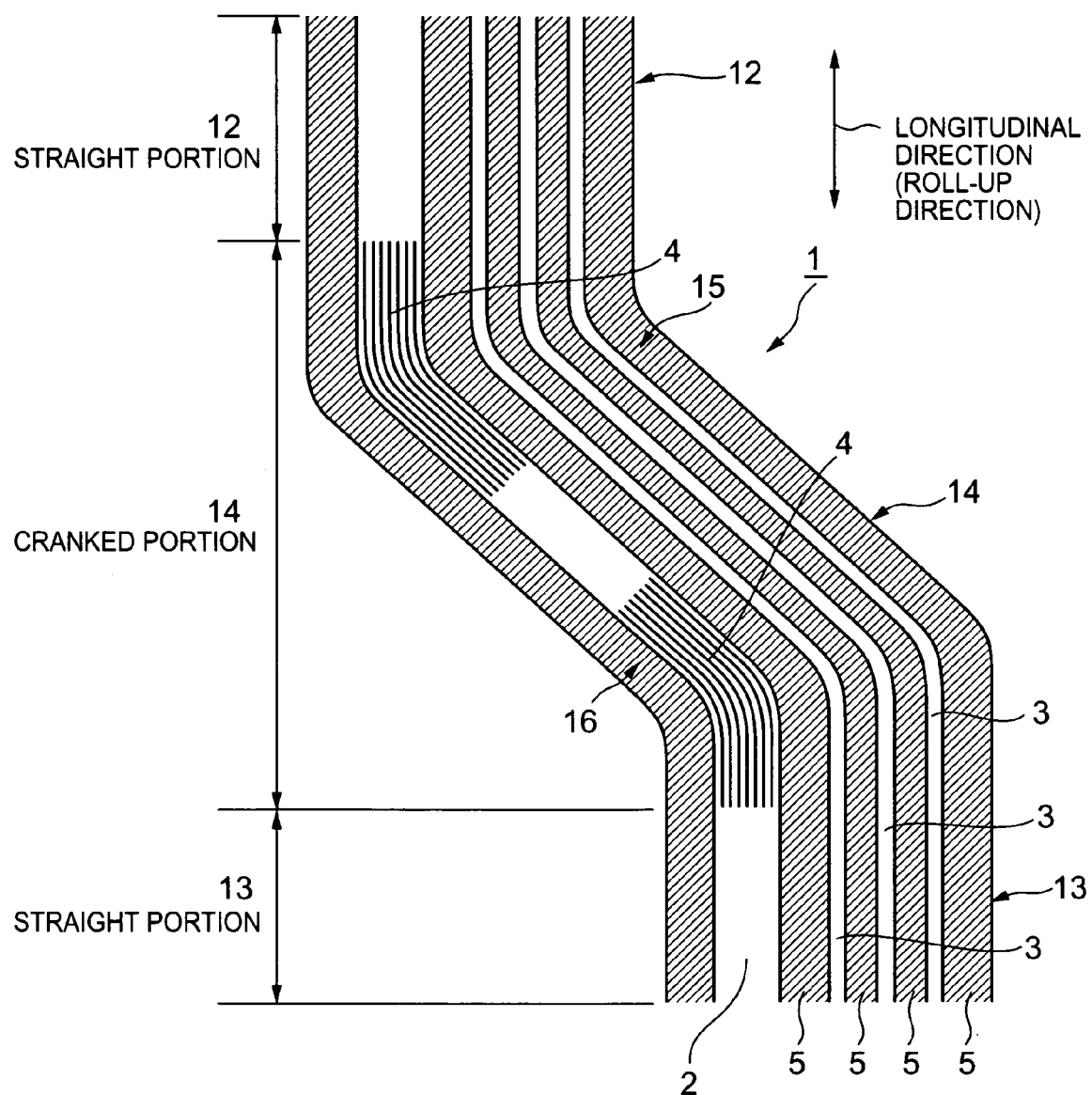
FIG. 2 is a plan view showing an enlarged view of a critical part of the flexible substrate of FIG. 1.

FIGS. 1 through 4 show a structural example of a flexible substrate 1 according to Embodiment 1. FIG. 1 is a plan view of the flexible substrate. FIG. 2 is a plan view showing an enlarged view of a critical part of the flexible substrate of FIG. 1.

As shown in FIG. 1, the flexible substrate 1 is larger in length than width. The (elongated) flexible substrate 1 has connection portions 8 and 9, which are end portions of the substrate, straight portions 12 and 13, which are extension portions, and a cranked portion 14, which is a bent portion, and is unitarily formed.

As shown in FIG. 2, the cranked portion 14 is composed of, portions extended from the straight portions 12 and 13, angled portions continued from the portions extended from the straight portions 12 and 13, and a linear portion formed between the angled portions in a direction oblique to the longitudinal direction of the flexible substrate 1.

As shown in FIG. 1, the connection portions 8 and 9 are at the ends of the flexible substrate 1. The connection portion 8 is connected to a connector 202 of the circuit substrate 201, which is placed in the first casing 200 shown in FIG. 14 (the circuit substrate 201 is indicated by a chain double-dashed line in FIG. 1).

The connection portion 9 is connected to a connector 302 of the circuit substrate 301, which is placed in the second casing 300 shown in FIG. 14 (the circuit substrate 301 is indicated by another chain double-dashed line in FIG. 1). The flexible substrate 1 electrically connects the circuit substrate 201 and the circuit substrate 301 to each other while inserted in the hinge 400 shown in FIG. 15.

As shown in FIG. 1, the cranked portion 14 is formed integrally and continuously between the connection portions 8 and 9 through the straight portions 12 and 13. That is, the cranked portion 14 is positioned between the straight portions 12 and 13.

The straight portions 12 and 13 are extended from the connection portions 8 and 9, respectively, in the longitudinal direction of the flexible substrate 1. The straight portions 12 and 13 are arranged in a staggered fashion in order to avoid overlapping each other when the flexible substrate 1 is bent in some way (rolled, for example).

In short, the cranked portion 14 is set diagonal with respect to the longitudinal direction of the flexible substrate 1 to reach the straight portions 12 and 13 both. The plan view of the flexible substrate 1 is therefore resembles the shape of the letter Z as shown in FIG. 1.

As shown in FIG. 2, on one side of the flexible substrate 1, a power supply line 2 and plural signal lines 3 are arranged in the straight portions 12 and 13 and the cranked portion 14 running between the connection portions 8 and 9 of FIG. 1 (only three of the plural signal lines 3 are shown in FIGS. 1 and 2). The power supply line 2 and the signal lines 3 are formed from a wiring conductor (copper foil or the like). The power supply line 2 and the signal lines 3 in FIG. 2 are indicated by outlined areas.

Figure 4:
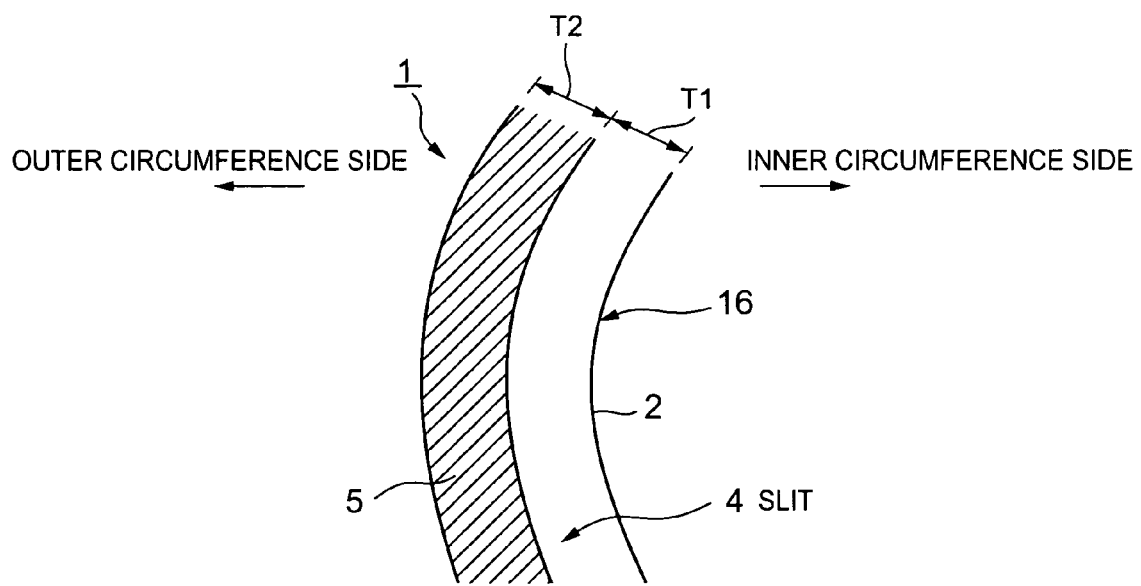
FIG. 4 is a sectional view showing an enlarged view of a bent portion in the flexible substrate of FIG. 3.

The power supply line 2 and the signal lines 3 have a predetermined thickness T1 (see FIG. 4) and are arranged at regular intervals on a base 5, which is formed from an insulator to a predetermined thickness T2 (see FIG. 4). The material used to form the base 5 is synthetic resin such as polyimide.

The power supply line 2 and the signal lines 3 make the circuit substrate 201 and the circuit substrate 301, which are indicated by the imaginary lines in FIG. 1, electrically conductive to each other. The width (in the direction orthogonal to the longitudinal direction) of the power supply line 2 is set such that the electric resistance of the power supply line 2 is equal to or lower than a predetermined level. In other words, the power supply line 2 is set to a given width or less in bar of malfunction by voltage drop.

The signal lines 3 may be smaller in width than the power supply line 2 since the signal lines 3 only have to supply a current as an electric signal (only have to carry a small amount of current). The power supply line 2 is therefore set larger in width than the signal lines 3. The power supply line 2 and the signal lines 3 have the same wiring conductor thickness T1 (see FIG. 4).

When the first casing 200 and the second casing 300 are opened and put in a deployed state as shown in FIG. 14 (when the second casing 300 is in the position indicated by the chain double-dashed line of FIG. 14), the cranked portion 14 of the flexible substrate 1 is rolled up in the hinge 400 shown in FIG. 15 by a degree not larger than 360° (one roll as shown in FIG. 15).

When the first casing 200 and the second casing 300 are closed and put in a folded state as shown in FIG. 14 (when the second casing 300 is in the position indicated by the chain dashed line of FIG. 14), the cranked portion 14 of the flexible substrate 1 is rolled up by a degree not larger than 540° (more than one roll).

As shown in FIG. 2, plural slits 4 are opened in the cranked portion 14, at least in each of border portions 15 and 16 which adjoin the straight portions 12 and 13, respectively. The border portions 15 and 16 cover the borders where the linear portion of the cranked portion 14 that is slanted with respect to the longitudinal direction of the flexible substrate 1 meets the straight portions of the cranked portion 14 that are extended vertically from the straight portions 12 and 13. In short, the cranked portion 14 is an area centered around the bend.

The slits 4 run along the direction of the power supply line 2 (the direction that conforms to the shape in plan view of the border portions 15 and 16). As shown in FIG. 4, the depth of the slits 4 is equal to the thickness T1 of the power supply line 2, which is a first wiring conductor. In other words, the slits 4 are formed by gouging the wiring conductor (power supply line 2) alone while leaving out the base 5.

The slits 4 are opened by cutting after the power supply line 2 is formed, for example. Note that any method is employable in forming the slits 4. The depth and width of the slits 4, the interval between the slits 4, the number of the slits 4, and the like are set at designer's discretion taking into account permissible current and other factors.

Figure 3:
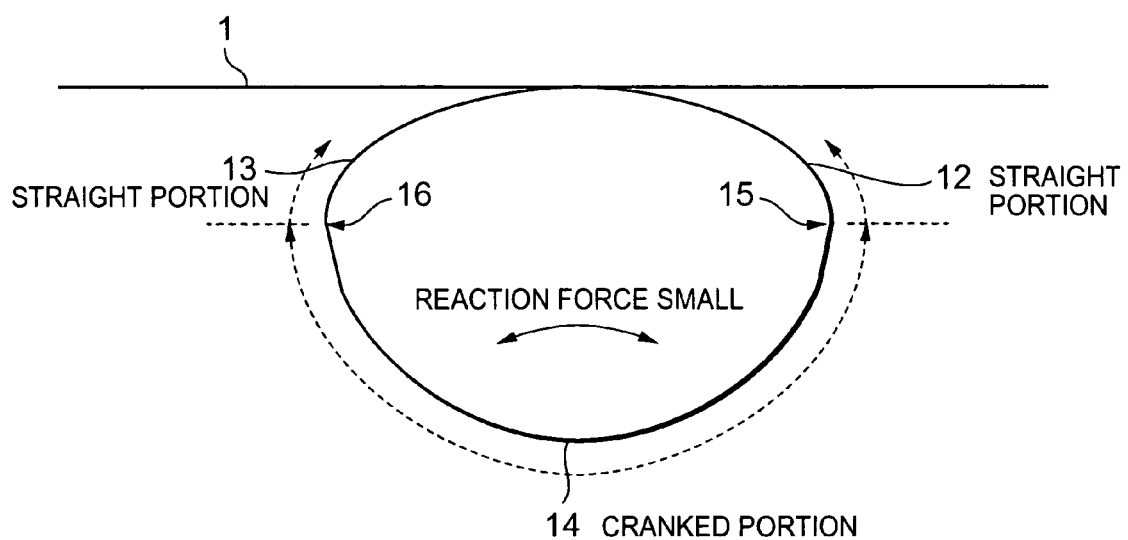
FIG. 3 is a conceptual diagram showing the flexible substrate of FIG. 1 with a cranked portion rolled up.

As shown in FIG. 2, the slits 4 are formed only in and around the border portions 15 and 16 on the power supply line 2 in the cranked portion 14. This is because the stress centers on the border portions 15 and 16 in the cranked portion 14 when bending the flexible substrate 1 as shown in FIG. 3.

In this embodiment, the slits 4 may be formed along the entire length of a portion of the power supply line 2 that is in the cranked portion 14. Also, the direction of the slits 4 in this embodiment can be changed arbitrarily, for example, to the direction that is orthogonal to the longitudinal direction of the flexible substrate 1. Furthermore, the cranked portion 14 which is continued from the straight portions 12 and 13 in this embodiment maybe placed in the direction that is orthogonal to the longitudinal direction of the flexible substrate 1.

The flexible substrate 1 is inserted in the hinge 400 shown in FIG. 15 and, in this state, electrically connects the circuit substrate 201 in the first casing 200 shown in FIG. 14 and the circuit substrate 301 in the second casing 300 shown in FIG. 14 to each other. The cranked portion 14 of the flexible. substrate 1 and portions of the straight portions 12 and 13 that adjoin the cranked portion 14 are housed in the hinge 400 shown in FIG. 15 with the cranked portion 14 rolled up as shown in FIG. 3.

According to the arrangement in the example of FIG. 4, the lines 2 and 3 which are wiring conductors are pulled to the inner circumference side when the cranked portion 14 is rolled up.

Figure 18:
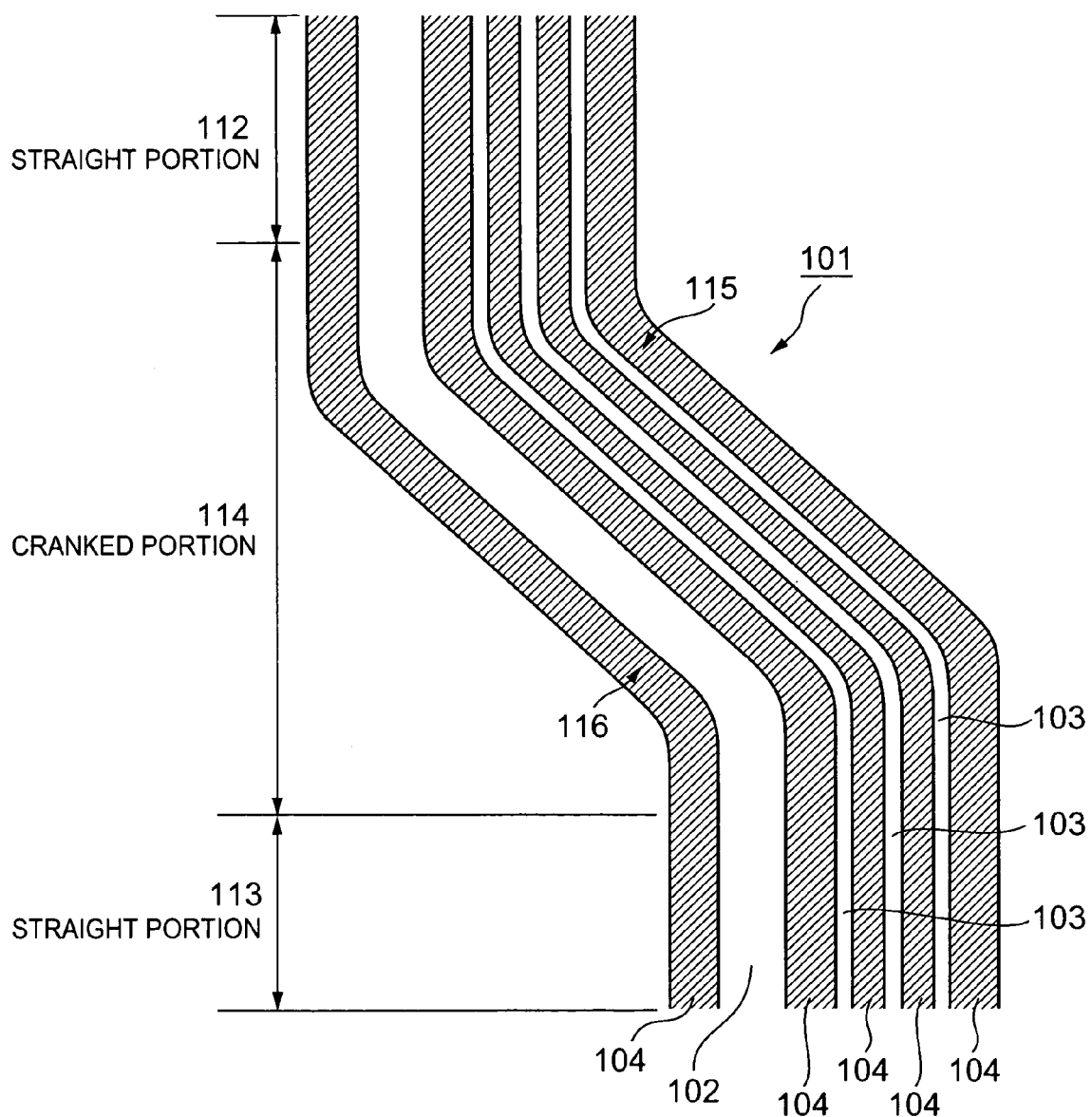
FIG. 18 is a plan view showing an enlarged view of a critical part of the flexible substrate in FIG. 16.
Figure 19:
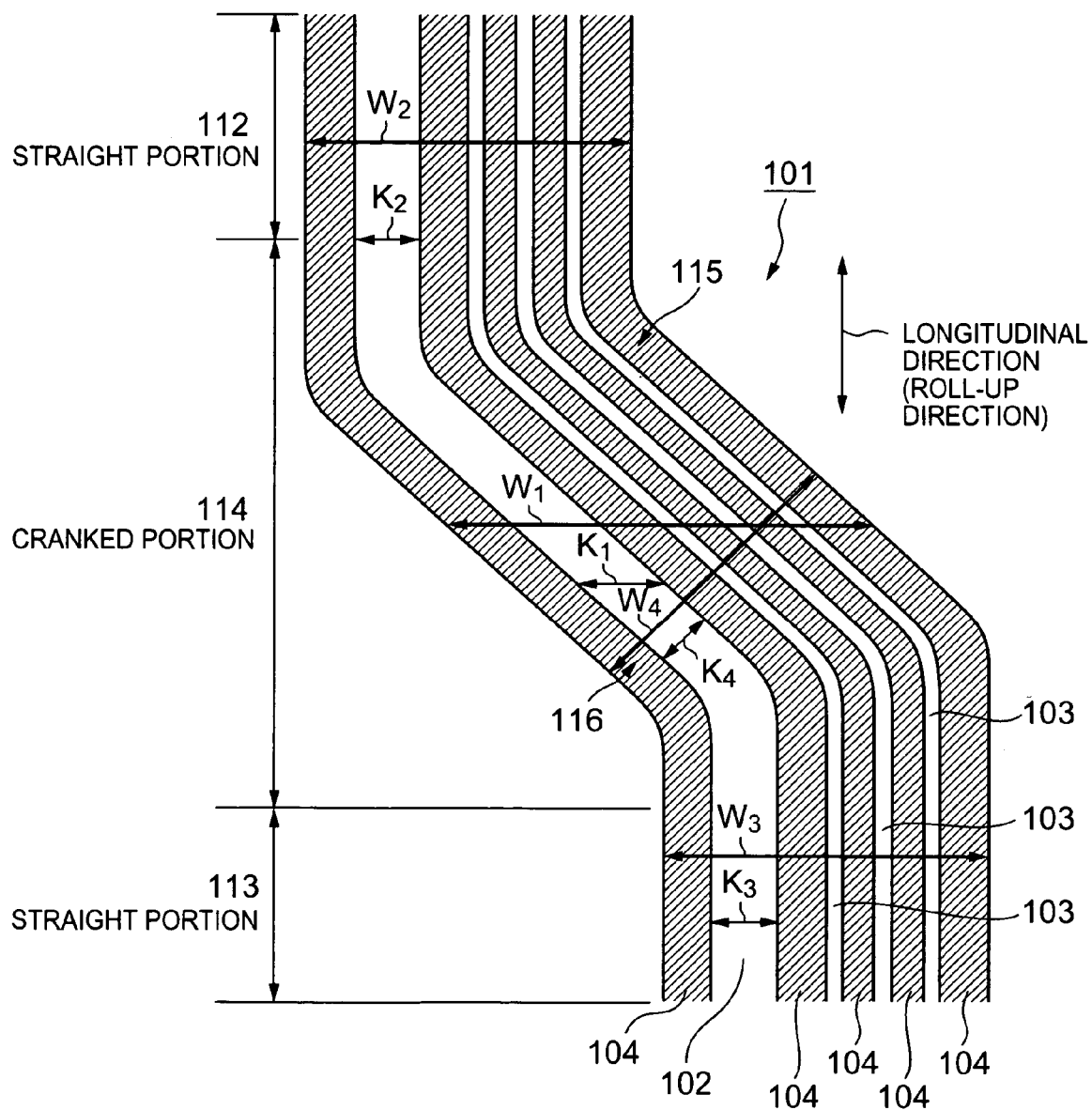
FIG. 19 is a plan view provided to consider the width of the flexible substrate shown in FIG. 18.
Figure 20:
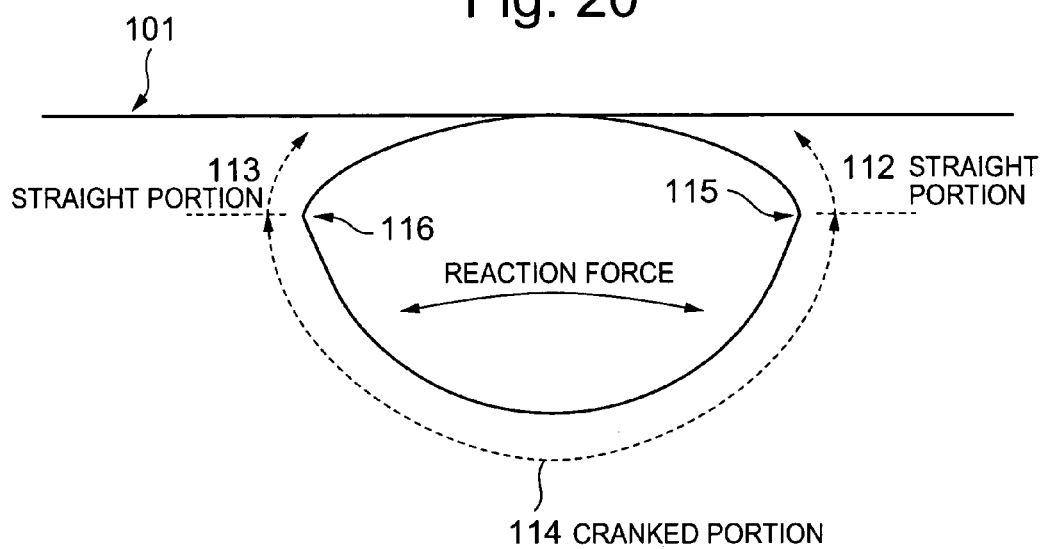
FIG. 20 is a conceptual diagram of the flexible substrate of FIG. 16 with a cranked portion rolled up.
Figure 21:
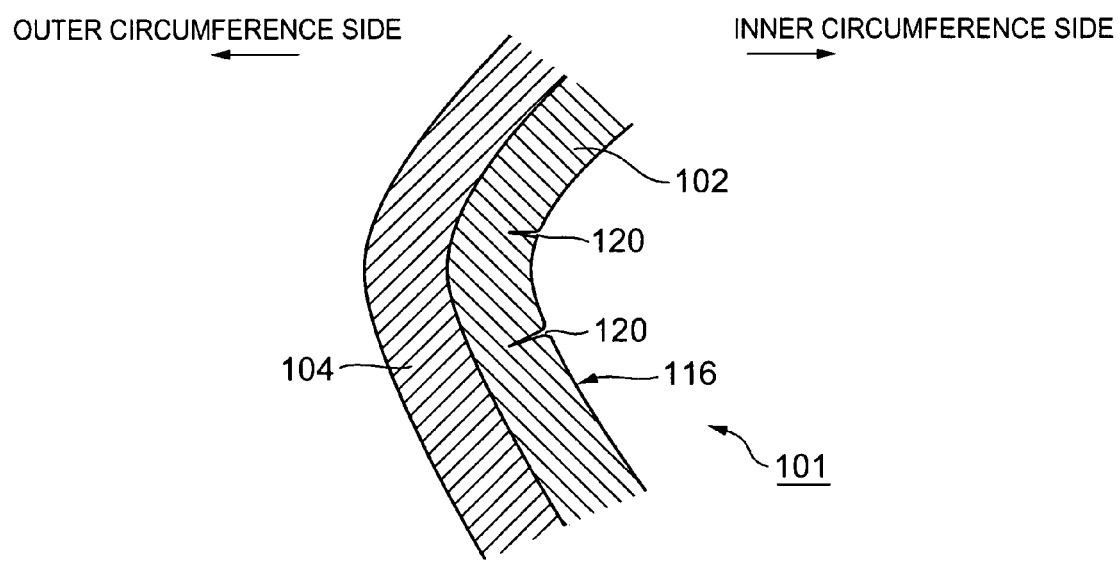
FIG. 21 is a sectional view showing an enlarged view of a bent portion of the flexible substrate of FIG. 20.

The rigidity of the cranked portion 14 is lower than in the conventional structure (the structure shown in FIG. 18) owing to the slits 4 opened in the portions of the power supply line 2 that are in the cranked portion 14. This makes the difference in rigidity between the cranked portion 14 and the straight portions 12 and 13 small and accordingly makes flexures in the border portions 15 and 16 small as shown in FIGS. 3 and 4.

In other words, a bending force working on the border portions 15 and 16 is made small. The power supply line 2 formed from a wiring conductor is therefore prevented from being squashed under the base 5. Concentration of stress on the border portions 15 and 16 is thus prevented.

Note that the arrangement in this embodiment may be changed so that the lines 2 and 3 are pulled to the outer circumference side. This construction can also make the bending force working on the border portions 15 and 16 small and accordingly eliminates concentration of stress on the border portions 15 and 16.

In the portable terminal S (see FIG. 14), stress concentration on the border portions 15 and 16 is thus avoided irrespective of repetitive deploying (opening) and folding (closing) of the first casing 200 and second casing 300 shown in FIG. 14. With the stress concentration eliminated, this embodiment is capable of avoiding cracks in the border portions 15 and 16 and thereby preventing wire breakage of the wiring conductor that forms the power supply line 2.

As described above, with the slits 4 opened in the wide portion of the power supply line 2 (wiring conductor) that is in the cranked portion 14, the line width (in the direction orthogonal to the longitudinal direction) is made substantially uniform throughout the entire length of the power supply line 2. The thus structured flexible substrate 1 is suitable for an application to the portable terminal S or like other electronic devices that are demanded to have advanced functions.

The flexible substrate 1 has high durability against repetitive deploying and folding of the first casing 200 and second casing 300 shown in FIG. 14, and is suitable for an application to the portable terminal S with advanced functions.

Embodiment 2

Embodiment 2 of the present invention is described with reference to FIGS. 5 through 9. A flexible substrate 17 according to this embodiment is obtained by overlapping two flexible substrates, namely, a first flexible substrate (hereinafter referred to simply as first substrate) 18 and a second flexible substrate (hereinafter shortened as second substrate) 19.

Figure 5:
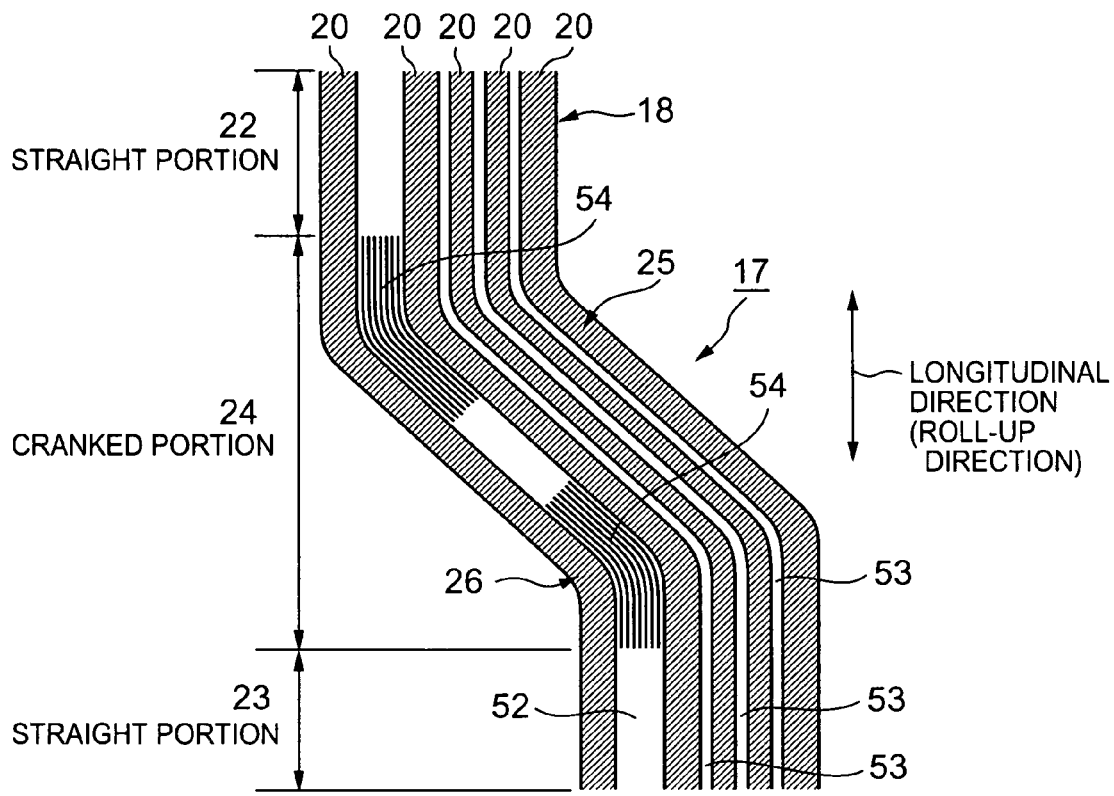
FIG. 5 is a plan view showing a critical (substantial) part of a first substrate which constitutes a flexible substrate according to Embodiment 2 of the present invention.

As shown in FIG. 5, the first substrate 18 has the same structure as the flexible substrate 1 of Embodiment 1. The first substrate 18 therefore includes connection portions, straight portions 22 and 23, and a cranked portion 24. The connection portions of the first substrate 18 correspond to the connection portions 8 and 9 of the flexible substrate 1 shown in FIG. 1, and hereinafter are denoted by the same symbols, 8 and 9, as their counterparts in FIG. 1.

One power supply line 52 and plural signal lines 53 are arranged on the front side of the straight portions 22 and 23 and the cranked portion 24 (only three of the plural signal lines 53 are shown in FIG. 5). The power supply line 52 and the signal lines 53 are formed from a wiring conductor. Plural slits 54 are opened in the power supply line 52 in the cranked portion 14, at least in each of border portions 25 and 26 which adjoin the straight portions 22 and 23, respectively. The power supply line 52 and the signal lines 53 in FIG. 5 are indicated by outlined areas.

Figure 6:
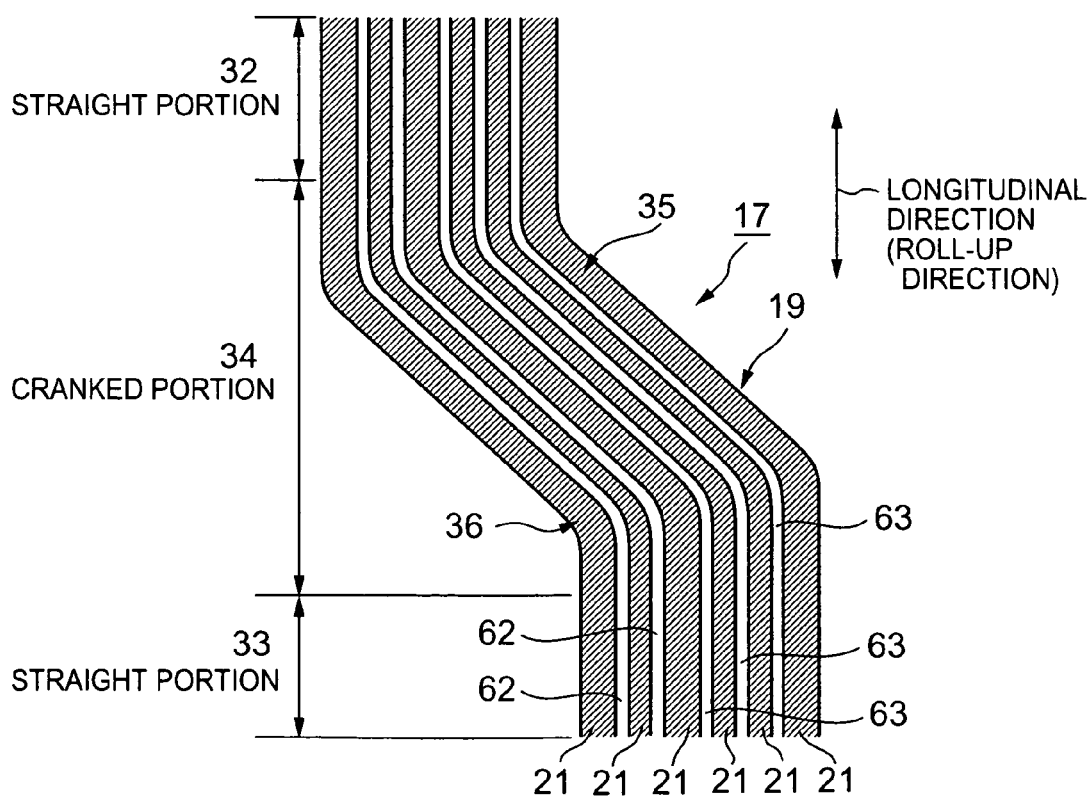
FIG. 6 is a diagram showing a critical part of a second substrate, which constitutes the flexible substrate according to Embodiment 2 of the present invention, viewed from the rear side of the flexible substrate.

As shown in FIG. 6, the second substrate 19 has substantially the same shape as the first substrate 18. FIG. 6 shows a view, taken from the rear side of the flexible substrate 17, of a side of the second substrate 19 where signal lines 62 and 63, which will be described later, are formed. To elaborate, FIG. 6 is a rear view of the flexible substrate 17 when the first substrate 18 and the second substrate 19 are overlapped back to back with the sides having the lines 52, 53, 62 and 63 facing outward and are disposed such that the second substrate 19 constitutes the rear side.

The second substrate 19 includes straight portions 32 and 33 and a cranked portion 34. The connection portions of the second substrate 19 according to this embodiment correspond to the connection portions 8 and 9 of the flexible substrate 1 shown in FIG. 1, and hereinafter are denoted by the same symbols, 8 and 9, as their counterparts in FIG. 1.

Plural overlapping signal lines 62 (only two of the plural overlapping signal lines 62 are shown in FIG. 6) and plural signal lines 63 (only three of the plural signal lines 63 are shown in FIG. 6) are arranged on the front side of the straight portions 32 and 33 and the cranked portion 34. The overlapping signal lines 62 and the signal lines 63 are formed from a wiring conductor. The power supply lines 62 and the signal lines 63 in FIG. 6 are indicated by outlined areas.

The second substrate 19 has no power supply line for supplying power. The signal lines 53 and 63 and the overlapping signal lines 62, which are a second wiring conductor, are lines provided for signal transmission and reception. The signal lines 53 and 63 are arranged in a staggered fashion so that the signal lines 53 are positioned alternately with the signal lines 63 (so that the signal lines 53 and 63 do not overlap each other) when the first substrate 18 and the second substrate 19 are overlapped each other.

Figure 7:
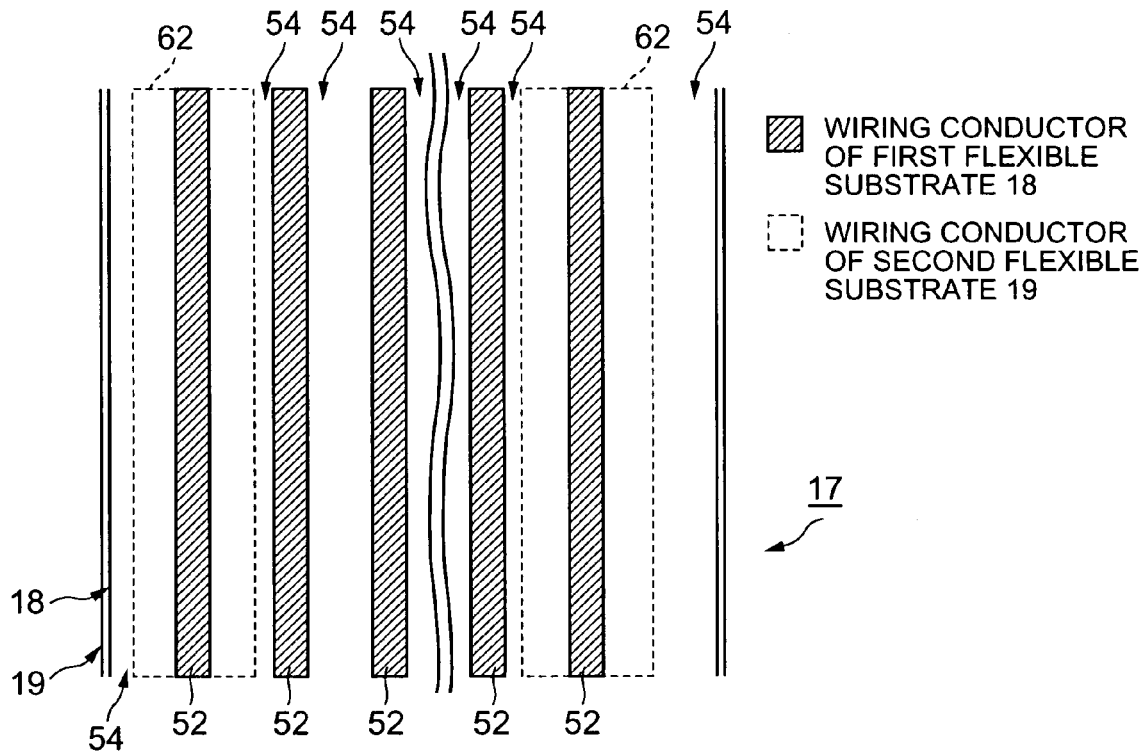
FIG. 7 is a plan view showing arrangement of a wiring conductor for a power supply line on the flexible substrate according to Embodiment 2.

The overlapping signal lines 62 are named so because the signal lines (second wiring conductor) 62 partially overlap the power supply line (first wiring conductor) 52 when the first substrate 18 and the second substrate 19 are overlapped with each other. As shown in FIG. 7, the signal lines 62 are arranged such that their positions correspond to the locations of the slits 54 opened in the power supply line 52.

FIG. 7 is a plan view showing arrangement of the wiring conductors (lines) on the front and rear sides of the flexible substrate 17 when the first substrate 18 and the second substrate 19 overlap each other in the manner described above.

Having the first substrate 18 and the second substrate 19, which overlap each other, the plural signal lines 53, the plural signal lines 62, and the plural signal lines 63, the flexible substrate 17 of this embodiment is suitable for an application to the portable terminal S and like other electronic devices that are demanded to have advanced functions.

As shown in FIG. 7, the second wiring conductor forming the overlapping signal lines 62 is positioned such that the signal lines 62 cover most part of the slits 54 in the power supply line 52 when the first substrate 18 and the second substrate 19 are overlapped with each other. In other words, most of the second wiring conductor of the overlapping signal lines 62 does not meet the first wiring conductor of the power supply line 52.

(Junction Structure between the First Substrate and the Second Substrate)

An adhesive or the like is applied to the connection portions of the first substrate 18 and of the second substrate 19. As mentioned above, the connection portions of the first and second substrates 18 and 19 are identical with the connection portions 8 and 9 of FIG. 1.

Application of an adhesive or the like is followed by overlapping the first substrate 18 and the second substrate 19 with each other and pressing down on the connection portions 8 and 9 to join the first substrate 18 and the second substrate 19 to each other.

In this embodiment, the connection portions 8 and 9 alone are bonded by an adhesive or the like instead of bonding the entire surfaces of the first substrate 18 and the second substrate 19 which include the power supply line 52 and the signal lines 53, 62 and 63, in order to avoid the following inconveniences:

Bonding the entire surfaces of the first substrate 18 and the second substrate 19 to each other makes the rigidity of the flexible substrate (multilayer substrate) 17 larger than that of a single-layer substrate. Therefore, when the flexible substrate 17 with the increased rigidity is bent, large flexures appear around the borders between the cranked portions 24 and 34 and the straight portions 22, 23, 33 and 34.

Figure 9:
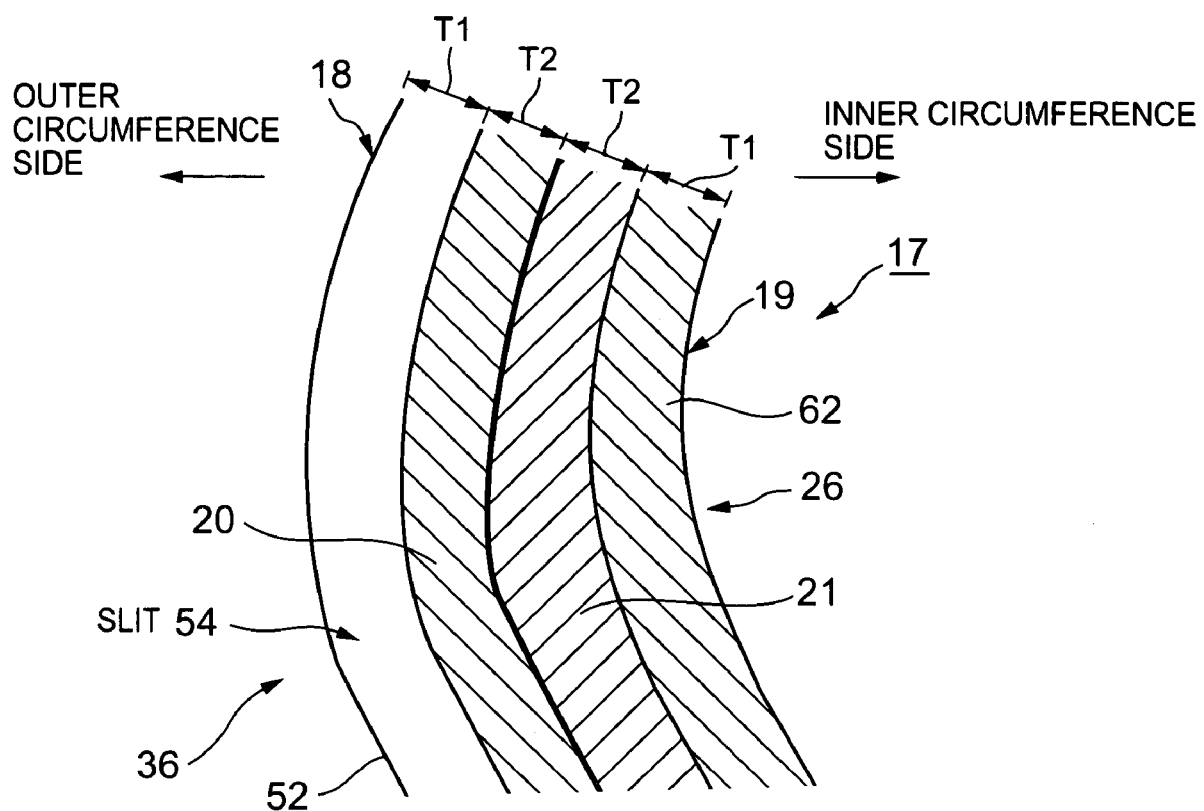
FIG. 9 is a sectional view showing an enlarged view of a bent portion in the flexible substrate of FIG. 8.

As shown in FIG. 9, the first substrate 18 and the second substrate 19 are overlapped back to back with the sides having the lines 52, 53, 62 and 63 facing outward, and are disposed such that the first substrate 18 constitutes the outer circumference side when the flexible substrate 17 is bent. Given below is the reason why the first substrate 18, which has the power supply line 52 wider than the overlapping signal lines 62, is chosen to constitute the outer circumference side upon bending of the flexible substrate 17.

If the first substrate 18 constitutes the inner circumference side when the flexible substrate 17, which is composed of two overlapping substrates 18 and 19, is bent, the stress centers on the inner-most power supply line 52. This is the reason why the first substrate 18 is chosen to be on the outer circumference side.

The second substrate 19 could come loose when, for instance, the flexible substrate 17 is bent with the second substrate 19 on the inner circumference side, thereby deviating from the first substrate 18 and creating a local distortion.

In this embodiment, only the connection portions 8 and 9 shown in FIG. 1 are pressed after application of an adhesive and joined to each other while avoiding bonding the straight portions 22, 23, 32 and 33 and the cranked portions 24 and 34 where the power supply line 52 and the signal lines 53, 62 and 63 are placed. The cranked portion 24 of the first substrate 18 and the cranked portion 34 of the second substrate 19 are therefore curved separately.

This enables the cranked portions 24 and 34 to curve more naturally compared to the case where the flexible substrate 17 is the multilayer substrate described above. As the first substrate 18 and the second substrate 19 are allowed to curve separately, a positional shift of the cranked portions 24 and 34 is avoided.

Figure 8:
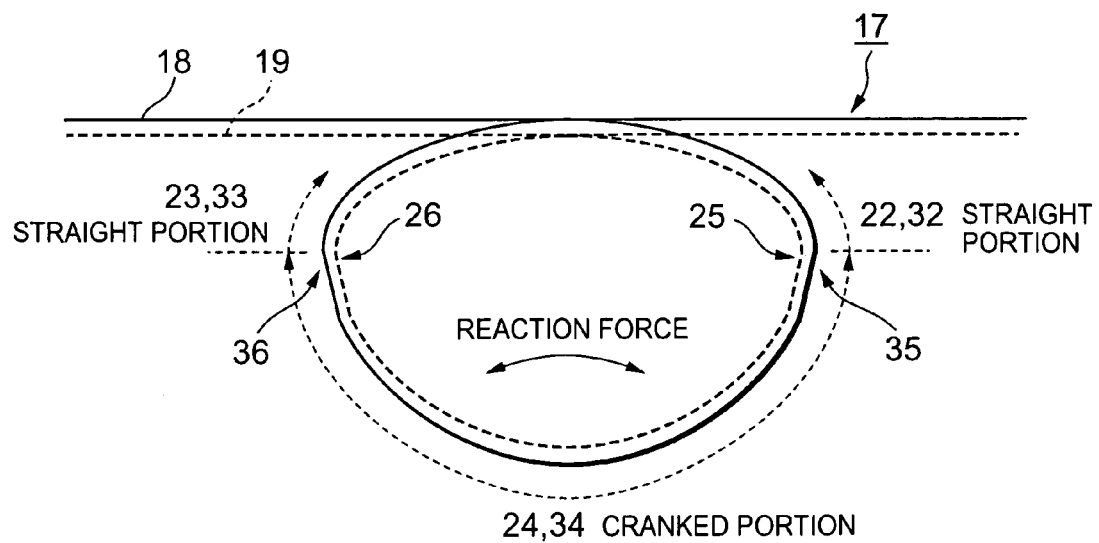
FIG. 8 is a conceptual diagram showing the flexible substrate of Embodiment 2 with a cranked portion rolled up.

As shown in FIG. 8, the flexible substrate 17 having the, first substrate 18 and the second substrate 19 overlapped with each other is rolled up. The hinge 400 shown in FIG. 15 houses the cranked portions 24 and 34 of the rolled up flexible substrate 17 and the straight portions 22, 23, 32 and 33 adjoining the cranked portions, 24 and 34.

In the first substrate 18, the width of the cranked portion 24 in the longitudinal direction (roll-up direction) is set larger than the width of the straight portions 22 and 23 in the roll-up direction.

Despite this setting, the straight portions 22 and 23 and the cranked portion 24 are curved approximately uniformly since, as in the flexible substrate 1 of Embodiment 1, the slits 54 are opened in the portions of the power supply line 52 that correspond to the cranked portions 24 and 34.

In this embodiment, stress concentration on a part of the flexible substrate 17, for example, on the overlapping signal lines (second wiring conductor) 62, can be avoided when the flexible substrate 17 is rolled up as shown in FIG. 9. This owes to the slits 54 opened in the power supply line (first wiring conductor) 52 of the first substrate 18 leave only a base 20 of the first substrate 18, a base 21 of the second substrate 19, and the overlapping signal lines (second wiring conductor) 62.

In short, in the slits 54 of the power supply line 52, no wiring conductor is present on the first substrate 18 and it makes the radius of curvature of the second substrate 19 large. Thus, in this embodiment, the stress on the overlapping signal lines (second wiring conductor) 62 of the second substrate 19 is eased as shown in FIG. 6.

With the slits 54 opened in the power supply line 52, in this embodiment, wire breakage of the overlapping signal lines (second wiring conductor) 62 on the inner circumference side is effectively and surely prevented even when the power supply line 52, which is wider than the overlapping signal lines 62, is on the outer circumference side.

This embodiment may be modified such that the flexible substrate 17 is bent with the second substrate 19 placed on the outer circumference side. In this case too, the stress on the first and second wiring conductors (lines 52 and 62) is eased by the slits 54 opened in the power supply line 52.

In conclusion, preventing cracks in the border portions 25, 26, 35 and 36 shown in FIG. 8 is possible also in the flexible substrate 17 in which the first substrate 18 and the second substrate 19 are overlapped with each other. The second wiring conductor (overlapping signal lines 62) is thus protected against wire breakage.

Note that this embodiment may be modified such that three or more substrates are overlapped with each other to constitute the flexible substrate 17. The second substrate 19 may have a power supply line identical to the power supply line 52, which is placed on the first substrate 18 alone in this embodiment. For the rest of the structure and effects, Embodiment 2 is similar to Embodiment 1 and therefore a description on details thereof is omitted here.

Embodiment 3

Figure 12:
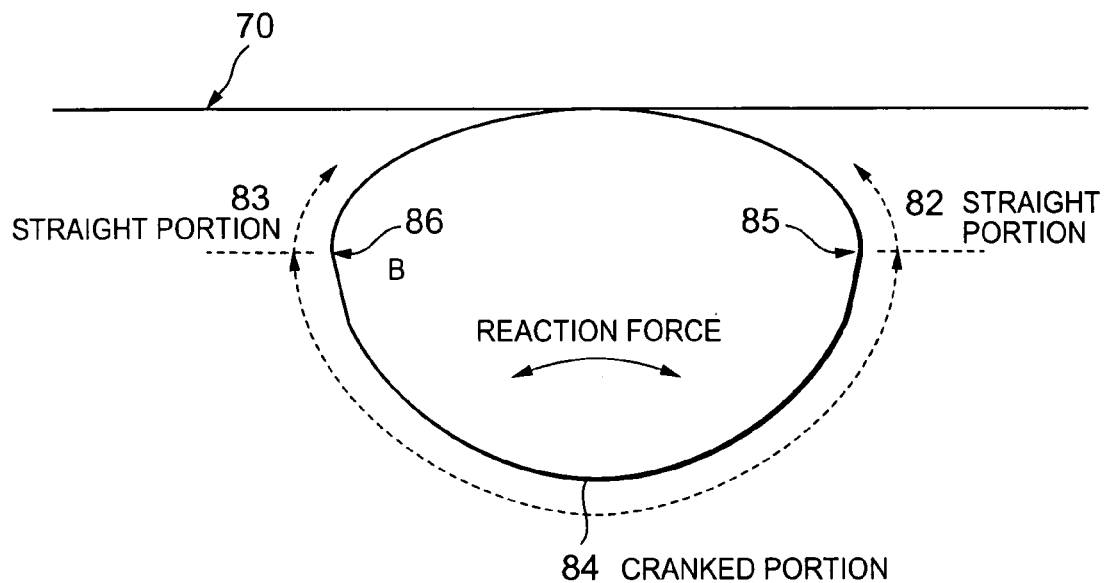
FIG. 12 is a conceptual diagram showing the flexible substrate of Embodiment 3 with a cranked portion rolled up.
Figure 13:
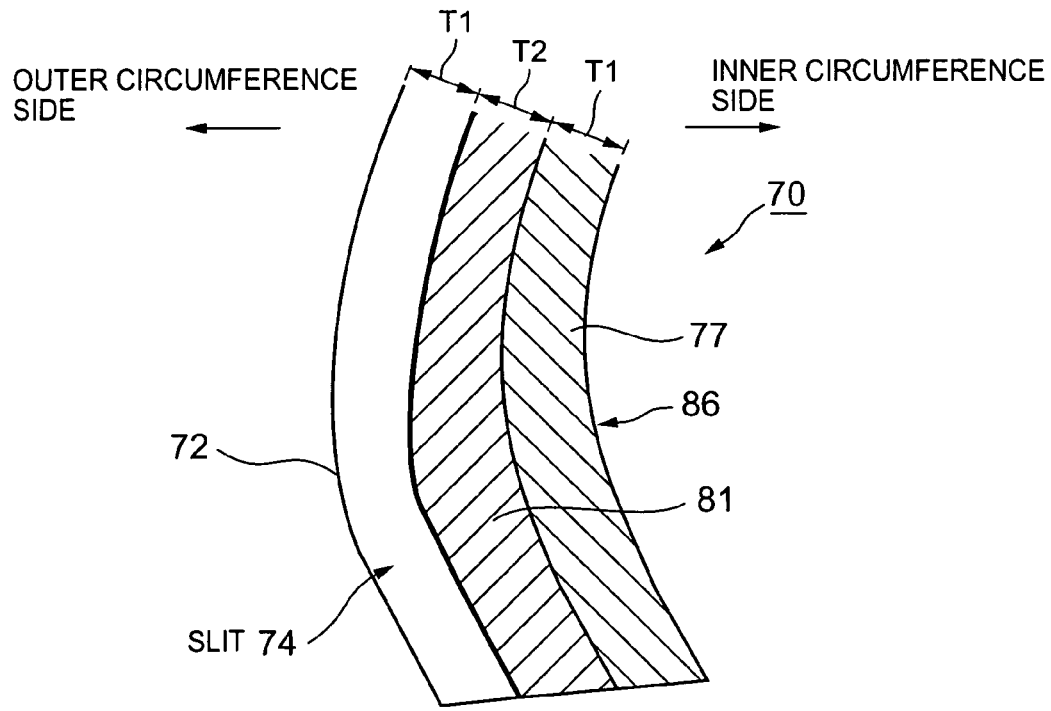
FIG. 13 is a sectional view showing an enlarged view of a bent portion in the flexible substrate of FIG. 12.

Embodiment 3 of the present invention is described with reference to FIGS. 10 through 13. As shown in FIG. 13, a flexible substrate 70 according to this embodiment has a base 81 which has lines of wiring conductors arranged on each side thereof. FIG. 10 is a plan view of the flexible substrate according to this embodiment. FIG. 11 is a rear view of the flexible substrate shown in FIG. 10.

As shown in FIG. 10, one power supply line 72 and plural signal lines 73 (only three of the signal lines 73 are shown in FIG. 10) are placed on one side of the base 81. As shown in FIG. 11, plural signal lines 76 (only three of the signal lines 76 are shown in FIG. 11) and plural overlapping signal lines 77 (only two of the overlapping signal lines 77 are shown in FIG. 11) are arranged on the other side of the base 82. The power supply line 72 and the signal lines 73 in FIG. 10 are indicated by outlined areas. The signal lines 76, 77 in FIG. 11 are indicated by outlined areas.

The flexible substrate 70, as in Embodiment 1, has straight portions 82 and 83 and a cranked portion 84. The power supply line 72 in this embodiment is formed on the outer circumference side of the flexible substrate 70 but may instead be formed on the inner circumference side of the flexible substrate 70.

As in Embodiments 1 and 2, plural slits 74 are formed in the cranked portion 84, at least in each of border portions 85 and 86 which adjoin the straight portions 82 and 83, respectively.

As shown in FIG. 13, a second wiring conductor for forming overlapping signal lines 77 is arranged such that the positions of the overlapping signal lines 77 approximately coincide with the locations of the slits 74 in the power supply line 72 with the base 81 interposed between the overlapping signal lines 77 and the slits 74. In other words, as in Embodiment 2, most of the second wiring conductor of the overlapping signal lines 77 does not meet the first wiring conductor of the power supply line 72.

In the slits 74 of the power supply line 72, as shown in FIGS. 10 and 13, no wiring conductor is present on the flexible substrate 70. This makes the radius of curvature of the flexible substrate 70 large when the flexible substrate 70 is rolled up as shown in FIG. 12. In the example shown in FIG. 13, as in Embodiment 2, the power supply line 72, which is wider than the overlapping signal lines 77, is placed on the outer circumference side.

The large radius of curvature of the flexible substrate 70 eases the stress on the overlapping signal lines (second wiring conductor) 77 of the flexible substrate 70 as shown in FIG. 13.

According to this embodiment, cracks in the border portions 85 and 86 shown in FIG. 12 can be avoided and accordingly the overlapping signal lines (second wiring conductor) 77 is protected against wire breakage. For the rest of the structure and effects, Embodiment 3 is similar to Embodiments 1 and 2 and therefore a description on details thereof is omitted here.

The above embodiments are merely examples of preferred mode of carrying out the present invention, and the invention is not limited thereto. For instance, a flexible substrate of the present invention may have plural power lines instead of one as in the above embodiments.

Furthermore, the above embodiments may be modified such that the slits are formed along the entire length of the power supply line in the longitudinal direction (the direction in which the power supply line is laid). Also, the above embodiments may have a ground line in addition to the power supply line.

The line width of the signal lines, the ground line, or the power supply line can be changed arbitrarily. It is also possible to open slits in the signal lines or the ground line. For instance, slits may be arranged on one side of the flexible substrate (front or rear, including the case where the flexible substrate is obtained by overlapping plural substrates) to overlap (coincide) with a wiring conductor on the other side. In this case, a wiring conductor on the one side of the flexible substrate does not overlap the wiring conductor on the other side of the flexible substrate and therefore the stress on the wiring conductors is eased.

Moreover, the shape in plan view of the flexible substrate can be changed arbitrarily and may be like a band (rectangular) The connection portions in the above embodiments may be extended from the straight portions at the same width in the longitudinal direction of the flexible substrate.

In the structural examples of the above embodiments, the cranked portion of the flexible substrate is rolled up in the hinge 400 by a degree not larger than 360° when the portable terminal S shown in FIG. 14 is deployed (when the second casing 300 is in the position indicated by the chain double-dashed line in FIG. 14), and by a degree not larger than 540° when the portable terminal S is folded (when the second casing 300 is in the position indicated by the chain dashed line in FIG. 14).

To give another structural example, the cranked portion of the flexible substrate may be turned in a hinge to 0° when the portable terminal S is deployed and 180° when the portable terminal S is folded. The effects of the present invention become more prominent as the radius of curvature of the flexible substrate becomes smaller.

Also, a circuit portion may be provided at an end of the flexible substrate in the present invention. In this case, the end of the flexible substrate means a continued part where the flexible substrate and the circuit portion. Two or more of the above embodiments or structural examples may be combined with one another.

The concept of an electronic device according to the present invention covers electronic devices that need the flexible substrates shown in the above embodiments, for example, cellular phones, personal computers, and PDAs (Personal Digital Assistants).

What is claimed is:

1. A flexible substrate with a wiring conductor running from a first end of the flexible substrate to a second end of the flexible substrate, comprising:
    a bent portion formed between the first end and the second end and bent as the flexible substrate is bent;
    a straight portion formed between the first end and the second end and not bent as the flexible substrate is bent; and
    a first wiring conductor laid on the bent portion and the straight portion, having slits in a portion of the first wiring conductor which portion corresponds to the bent portion and having no slits in a portion of the first wiring conductor which portion corresponds to the straight portion, wherein the slits are formed in portions of the first wiring conductor that are only in and around border portions where the bent portion borders the first end and the second end in a manner that makes the slits run along the line direction of the first wiring conductor in the border portions.

2. The flexible substrate according to claim 1,
    wherein the flexible substrate is larger in length than width, the first end and the second end are formed in a longitudinal direction of the flexible substrate and are arranged in a staggered fashion to avoid overlapping of the first end and the second end when the flexible substrate is bent, and
    wherein the bent portion is placed in a direction which is not the longitudinal direction while heading toward the first end and the second end.

3. The flexible substrate according to claim 1, wherein the slits are opened in the wiring conductor whose line width is larger than that of the wiring conductor for forming signal lines.

4. The flexible substrate according to claim 1,
    wherein a first circuit substrate to be placed in a first casing is connected to a connection portion on one end of the first end and the second end, and
    wherein a second circuit substrate to be placed in a second casing is connected to a connection portion on the other end of the first end and the second end.

5. The flexible substrate according to claim 4, wherein the slits are formed in portions of the first wiring conductor that are only in and around border portions where the bent portion borders the first end and the second end in a manner that makes the slits run along the line direction of the first wiring conductor in the border portions.

6. An electronic device comprising a flexible substrate with a wiring conductor running from a first end of the flexible substrate to a second end of the flexible substrate,
    wherein the flexible substrate comprises:
    a bent portion formed between the first end and the second end and bent as the flexible substrate is bent;
    a straight portion formed between the first end and the second end and not bent as the flexible substrate is bent; and
    a first wiring conductor laid on the bent portion and the straight portion, having slits in a portion of the first wiring conductor which portion corresponds to the bent portion and having no slits in a portion of the first wiring conductor which portion corresponds to the straight portion, wherein the slits are formed in portions of the first wiring conductor that are only in and around border portions where the bent portion borders the first end and the second end in a manner that makes the slits run along the line direction of the first wiring conductor in the border portions.

7. The electronic device according to claim 6,
    wherein the flexible substrate is larger in length than width, the first end and the second end are formed in a longitudinal direction of the flexible substrate are arranged in a staggered fashion to avoid overlapping of the first end and me second end when the flexible substrate is bent, and
    wherein the bent portion is placed in a direction which is not the longitudinal direction while heading toward the first end and the second end.

8. An electronic device comprising:
    a first circuit substrate placed in a first casing;
    a second circuit substrate placed in a second casing, the second casing being foldable to be flat against the first casing; and
    a flexible substrate formed between the first circuit substrate and the second circuit substrate, the flexible substrate including:
    (1) a bent portion which is bent as the circuit substrates are rotated relative to each other by folding the casings;
    (2) a straight portion formed between a first end and a second end of the flexible substrate and not bent as the flexible substrate is bent; and
    (3) a first wiring conductor on the flexible substrate, which is laid on the bent portion and the straight portion and which has slits opened in a portion of the first wiring conductor which portion corresponds to the bent portion and having no slits in a portion of the first wiring conductor which portion corresponds to the straight portion, wherein the slits are formed in portions of the first wiring conductor that are only in and around border portions where the bent portion borders the first end and the second end in a manner that makes the slits run along the line direction of the first wiring conductor in the border portions.

9. The electronic device according to claim 8, further comprising a hinge for joining the first casing and the second casing to each other in a foldable manner, the bent portion of the flexible substrate is housed being the hinge.

10. The electronic device according to claim 9, wherein the bent portion of the flexible substrate which is housed in the hinge is wound once when the casings are deployed, and wherein the bent portion of the flexible substrate which is housed in the hinge is wound more than once when the casings are folded.

11. The electronic device according to claim 8, wherein extension portions are formed in the flexible substrate, which is larger in length than width, along the longitudinal direction of the flexible substrate and are arranged in a staggered fashion to avoid overlapping of the extension portions when the flexible substrate is bent, and wherein the bent portion is placed in a direction which is not the longitudinal direction while heading toward the extension portions.

12. A flexible substrate with a base and a wiring conductor running from a first end of the flexible substrate to a second end of the flexible substrate, comprising:

a bent portion formed between the first end and the second end and bent as the flexible substrate is bent;

a straight portion formed between the first end and the second end and not bent as the flexible substrate is bent; and a first wiring conductor laid on the bent portion and the straight portion and having a slit in a portion of the first wiring conductor which portion corresponds to the bent portion and having no slit in a portion of the first wiring conductor which portion corresponds to the straight portion wherein the base has no slit in the portion that corresponds to the bent portion, wherein the slits are formed in portions of the first wiling conductor that are only in and around border portions where the bent portion borders the first end and the second end in a manner that makes the slits run along the line direction of the first wiring conductor in the border portions.

13. An electronic device comprising a flexible substrate with a base having no slit and a wiring conductor running from a first end of the flexible substrate to a second end of the flexible substrate, wherein the flexible substrate comprises:

a bent portion formed between the first end and the second end and bent as the flexible substrate is bent;

a straight portion formed between the first end and the second end and not bent as the flexible substrate is bent; and a first wiring conductor laid on the bent portion and the straight portion and having a slit in a portion of the first wiring conductor which portion corresponds to the bent portion and having no slit in a portion of the first wiring conductor which portion corresponds to the straight portion, wherein the slits arc formed in portions of the first wiring conductor that are only in and around border portions where the bent portion borders the first end and the second end in a manner that makes the slits run along the line direction of the first wiring conductor in the border portions.

14. An electronic device comprising:

a first circuit substrate placed in a first casing;

a second circuit substrate placed in a second casing, the second casing being foldable to be flat against the first casing; and a flexible substrate formed between the first circuit substrate and the second circuit substrate, the flexile substrate including:

(1) a bent portion which is bent as the circuit substrates are rotated relative to each other by folding the casings;

(2) a straight portion formed between a first end and a second end of the flexible substrate and not bent as the flexible substrate is bent;

(3) a first wiring conductor on the flexible substrate, which is laid on the bent portion and the straight portion and which has a slit opened in a portion of the first wiring conductor which portion corresponds to the bent portion and having no slit in a portion of the first wiring conductor which portion corresponds to the straight portion; and (4) a base which has no slit, wherein the slits are formed in portions of the first wiring conductor that are only in and around border portions where the bent portion borders the first end and the second end in a manner that makes the slits run along the line direction of the first wiring conductor in the border portions.

* * * * *